United States Patent
Ito et al.

(10) Patent No.: US 6,577,551 B2
(45) Date of Patent: Jun. 10, 2003

(54) SEMICONDUCTOR INTEGRATED CIRCUIT HAVING A BUILT-IN DATA STORAGE CIRCUIT FOR NONVOLATILE STORAGE OF CONTROL DATA

(75) Inventors: Mikihiko Ito, Yokohama (JP); Masaru Koyanagi, Yokohama (JP); Takahiko Hara, Yokohama (JP); Satoru Takase, Yokohama (JP); Tohru Kimura, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/007,148

(22) Filed: Dec. 4, 2001

(65) Prior Publication Data

US 2002/0067633 A1 Jun. 6, 2002

(30) Foreign Application Priority Data

Dec. 6, 2000 (JP) ......................... 2000-371939

(51) Int. Cl.[7] .................................. G11C 7/00
(52) U.S. Cl. ...................... 365/225.7; 327/525; 365/96
(58) Field of Search ................. 365/225.7, 96, 365/185.09; 327/525

(56) References Cited

U.S. PATENT DOCUMENTS

| 6,055,197 A | * | 4/2000 | Kato et al. ............. 365/189.07 |
| 6,088,281 A | | 7/2000 | Miyakawa et al. ...... 365/225.7 |
| 6,118,712 A | * | 9/2000 | Park et al. .................. 365/200 |

* cited by examiner

Primary Examiner—Son Mai
(74) Attorney, Agent, or Firm—Hogan & Hartson, LLP

(57) ABSTRACT

A semiconductor integrated circuit includes a control data storage circuit (6) having nonvolatile storage devices with programmed control data and a latch circuit for holding data read out from the storage devices, and a read control circuit (7) for controlling read operations of the control data, which are built in a semiconductor chip. The control data storage circuit (6) is divided into groups (1, 2), and the read control circuit (7) generates read control signals for the groups (1, 2) at different timings, using an output of an internal potential detecting circuit 41 as the timing reference, thereby preventing the peak of power consumption from unacceptably rising during reading operations.

26 Claims, 27 Drawing Sheets

SEMICONDUCTOR INTEGRATED CIRCUIT HAVING A BUILT-IN DATA STORAGE CIRCUIT FOR NONVOLATILE STORAGE OF CONTROL DATA

CROSS-REFERENCE TO RELATED APPLICATIONS

This application is based upon and claims the benefit of priority from the prior Japanese Patent Application No. 2000-371939, filed on Dec. 6, 2000, the entire contents of which are incorporated herein by reference.

FIELD OF THE INVENTION

This invention relates to a semiconductor integrated circuit having a built-in data storage circuit for nonvolatile storage of control data.

BACKGROUND OF THE INVENTION

For years, in various semiconductor integrated circuits such as memory devices, a control data storage circuit has been formed in a chip for storing control data in a nonvolatile mode by executing programming after the wafer process. Such "control data" stored in this kind of control data storage circuits includes data for establishing the operation mode of the chip, adjustment data for adjusting the operation timing in the chip, adjusting the output voltage of the internal voltage generating circuit, and so on, chip ID information, etc. Especially, those for semiconductor memory devices include defective address judgment data for replacing a defective cell with a spare cell.

As nonvolatile memory devices of this kind of control data storage circuits, there are laser-meltdown fuses (hereinafter called laser fuses) and electrically programmable fuses (hereinafter called electric fuses). Especially, laser fuses are frequently used because of their simple structure and easy layout, but their programming is possible only before they are packaged. In contrast, electric fuses, although complicated in structure, can be programmed even after they are packaged.

Typically, data of a programmed nonvolatile memory device is read out and held in a latch circuit when the power source rises, and operative conditions of the chip will be controlled based on the data held by the latch circuit.

The above-introduced control data storage circuit has been increased in capacity along with movements of semiconductor integrated circuits toward larger scales and higher performances, and has come to include a lot of nonvolatile storage devices. Especially in semiconductor memory devices, under progressive miniaturization and movements toward larger capacities, spare rows and spare columns are prepared for enabling replacement of defective addresses to improve the production yield, and a defective address storage circuit also occupies large capacity and area.

Under the circumstances, when data of a nonvolatile storage device of the control data storage circuit is read out simultaneously with introduction of the power source, there occurs the problem that instantaneous power consumption becomes large and the peak of power consumption rises.

BRIEF SUMMARY OF THE INVENTION

According to an embodiment of the invention, there is provided a semiconductor integrated circuit comprising:

a control data storage circuit having a plurality of groups each made up of nonvolatile storage devices where control data is programmed, and a latch circuit for holding read control data from said nonvolatile storage devices; and a read control circuit for controlling read operations of each said control data from said nonvolatile storage devices at different timings for the respective groups.

According to another embodiment of the invention, there is provided a semiconductor integrated circuit comprising:

a control data storage circuit having a plurality of groups each made up of nonvolatile storage devices where control data is programmed, and a latch circuit for holding read control data from said nonvolatile storage devices; and first and second read control circuits each controlling read operations of said control data from said nonvolatile storage devices to take place at different timings for the respective groups.

DETAILED DESCRIPTION OF THE INVENTION

Some embodiments of the invention will now be explained below with reference to the drawings.

Figure 1:
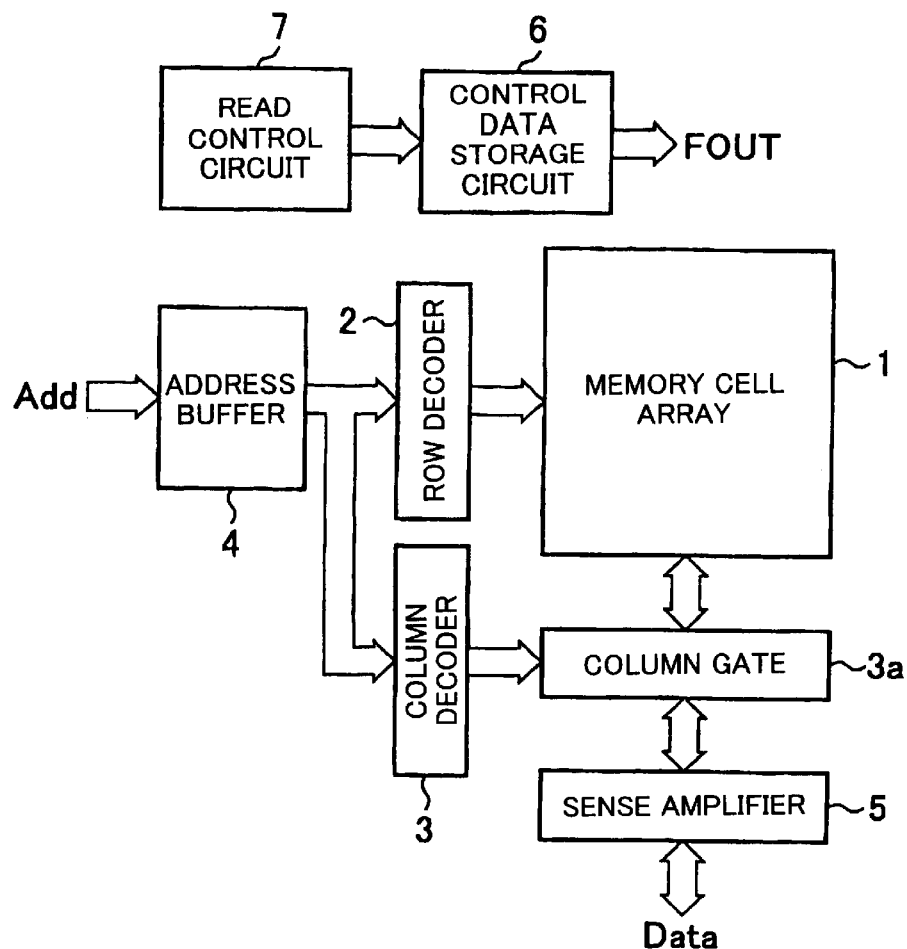
FIG. 1 is a diagram that shows configuration of a semiconductor integrated circuit to which the invention is applied.

FIG. 1 shows general configuration of a semiconductor memory integrated circuit according to an embodiment of the invention. The core portion of the integrated circuit includes a memory cell array 1 that is an arrangement of memory cells, row decoder 2 and column decoder 3 for selection of a word line and a bit line, respectively, of the memory cell array 1, and a column gate 3a. An external address is input to an address buffer 4, and corresponding row address and column address are sent to the row decoder 2 and the column decoder 3, respectively. A selected bit line of the memory cell array 1 is connected to a sense amplifier 5 via the column gate 3a to have data read out or written.

In order to program and store control data of this memory integrated circuit chip, a control data storage circuit 6 using a nonvolatile storage device is provided. Control data held in the control data storage circuit 6 includes defective address judgment data of redundancy as representative one thereof, but may includes other data, such as data for establishing the operative mode of the chip, adjustment data for adjusting the operation timing in the chip or for adjusting the output voltage of the internal voltage generating circuit, chip ID information, and so on.

Figure 2:
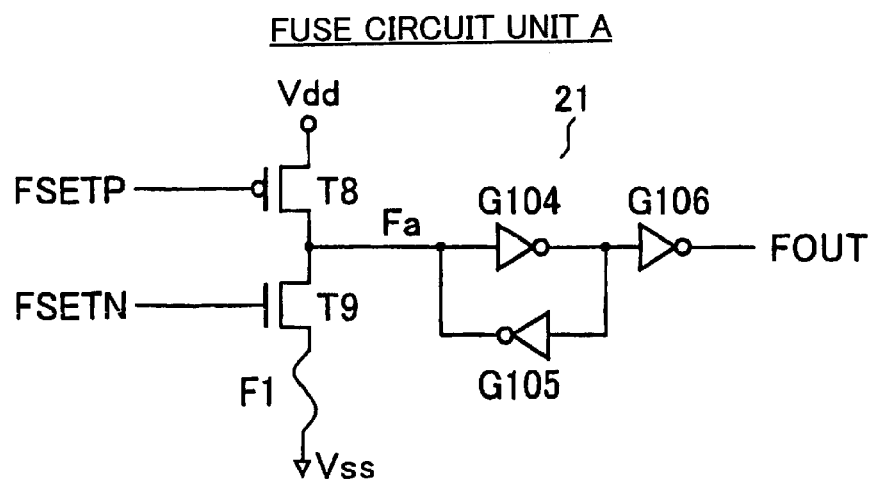
FIG. 2 is a diagram that shows configuration of a fuse circuit unit A used in a control data storage circuit of FIG. 1.
Figure 3:
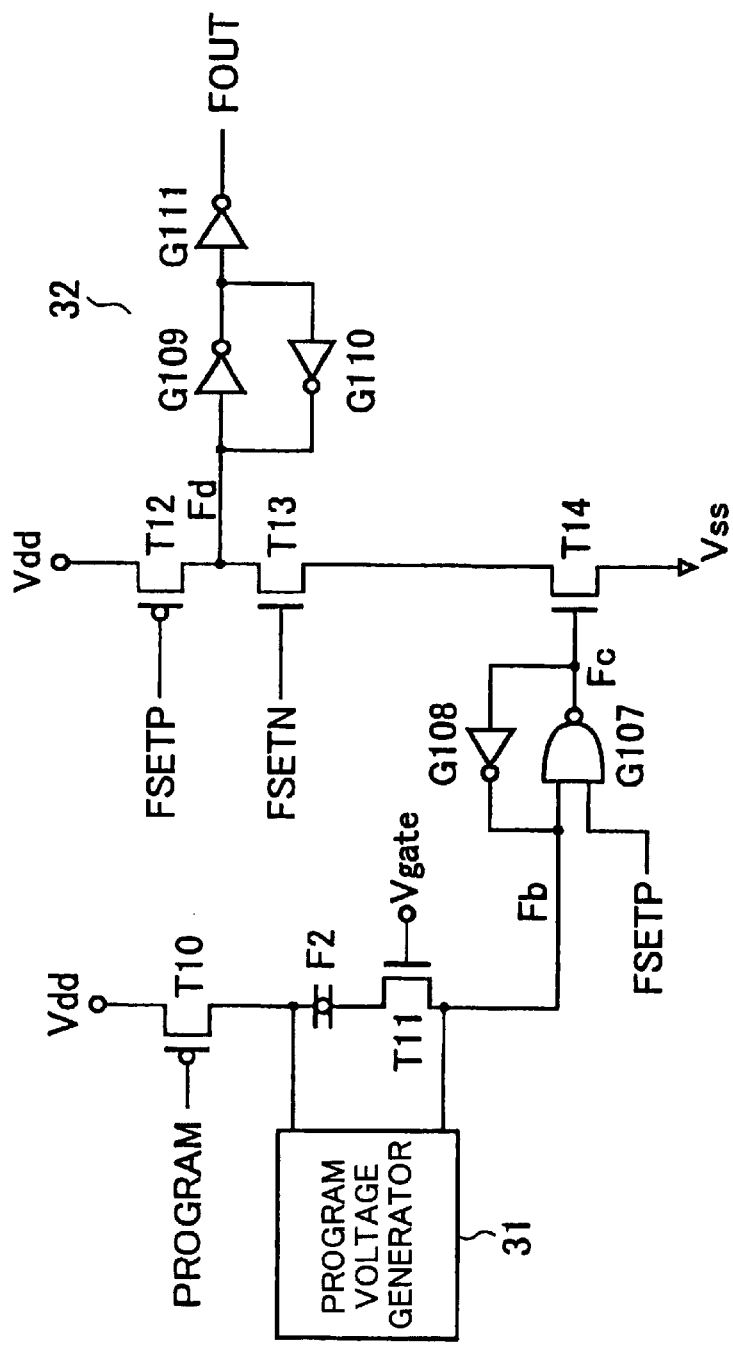
FIG. 3 is a diagram that shows configuration of another fuse circuit unit B used in the control data storage circuit of FIG. 1.

A representative nonvolatile storage device used in the control data storage circuit 6 is a laser fuse or an electric use. Specifically, in case of the laser fuse, the fuse circuit comprises a plurality of fuse circuit units A as shown in FIG. 2. In case of the electric fuse, it comprises a plurality of fuse circuit units B as shown in FIG. 3.

For the purpose of reading out the fuse data of the control data storage circuit 6 when the power source is introduced, a read-out control circuit 7 is provided.

The fuse circuit unit A shown in FIG. 2 includes a laser fuse F1 having one end grounded to Vss, an NMOS transistor T9 and PMOS transistor T8 serially connected between the other end of the laser fuse F1 and the power source Vdd. The NMOS transistor T9 and the PMOS transistor T8 are controlled respectively by control signals FSETN and FSETP output from the read control circuit 7.

A latch circuit 21 is connected to a connection node Fa between the NMOS transistor T9 and the PMOS transistor T8 to hold fuse data read out. The latch circuit 21 is made up of inverters G 104 and G105 in oppositely parallel connection. Output of the latch circuit 21 is output as fuse data FOUT through another inverter G106.

To read out fuse data, the PMOS transistor T8 is first turned ON by the control signal FSETP to precharge the node Fa to Vdd. Thereafter, the PMOS transistor T8 is turned OFF, and the NMOS transistor T9 is turned ON by the control signal FETSN. Thus the fuse data is read out. In case the fuse F1 is cut off (programming period), even when the NMOS transistor T9 is turned ON, the node Fa does not discharge and maintains the "H" level. In case the fuse F1 is not cut off (non-programming period), when the NMOS transistor T9 turns ON, the node Fa discharges and changes to the "L" level. This level of the node Fa is held in the latch circuit 1. Therefore, the fuse data FOUT becomes "H" in the programming period and "L" in the non-programming period.

In the fuse circuit unit B using the electric fuse F2, shown in FIG. 3, the circuit for high-voltage programming is intricate. The electric fuse F2 is a capacitor, with one end connected to the power source Vdd via a PMOS transistor T10 held OFF in the programming period by a control signal PROGRAM and the other end connected to one of input ends of a data transfer NAND gate F107 via a barrier-purpose NMOS transistor T11. A program voltage generating circuit 31 is connected between opposite ends of the electric fuse F2 and the NMOS transistor T11 to apply a high voltage. The control signal FSETP enters into the other input end of the NAND gate G107.

An inverter G108 is connected between input and output ends of the NAND gate G107 to form a latch for holding data for a while. An output node Fc of the NAND gate G107 is connected to the gate of a sensing NMOS transistor T14 having a ground source. The drain of the NMOS transistor T14 is connected to the power source Vdd via the NMOS transistor T13 and the PMOS transistor T12 to which the control signals FSETN and FSETP enter, respectively.

A connection node Fd between the NMOS transistor T13 and the PMOS transistor T12 is a fuse data terminal to be read out by the sensing NMOS transistor T14, and the latch circuit 32 for holding the fuse data is connected. The latch circuit 32 is made up of the inverters G109, G110 in oppositely parallel connection. The output of the latch circuit 32 will be output as fuse data FOUT via another inverter G111.

Programming of the electric fuse F2 is performed by turning OFF the PMOS transistor T10, thereby cutting the electric fuse F2 from the power source Vdd, and inputting a high voltage from the program voltage generating circuit 31. Application of a high voltage renders the electric fuse F2 conductive. That is, the electric fuse F2 stores data through the conductive condition (programming period) and the non-conductive condition (non-programming period).

Reading is affected by turning the barrier-purpose NMOS transistor T11 ON while the power source Vdd is supplied to one end of the electric fuse F2 via the PMOS transistor T10 held ON all the time except the programming period. Given to the gate of the NMOS transistor T11 is an internal booster potential Vgate that rises together with a rise of the power source Vdd by the introduction of the power source. When the booster potential Vgate reaches a certain value, the NMOS transistor T11 turns ON, and the electric fuse F2 becomes conductive, thereby to render the node Fb "H" (programming period), or the electric fuse F2 does not become conductive, thereby to render the node Fb "L" (non-programming period).

In the period where the control signal FSETP from the read control circuit remain "L", the PMOS transistor T12 turns ON, and the node Fd is precharged to Vdd. When the control signal FSETP becomes "H", the precharging operation of the node Fd terminates. Simultaneously, the NAND gate G is activated, and data of the node Fb is transferred to the gate of the sensing NMOS transistor T14. That is, in case the node Fb is "H" (programming period), the node Fc becomes "L". In case the node Fb is "L" (non-programming period), the node Fc becomes "H".

As a result, the sensing NMOS transistor T14 turns ON or OFF depending upon the data. Then, when the control signal FSETN output from the read control circuit becomes "H", the precharged node Fd maintains "H" because the NMOS transistor T14 is held OFF in the programming period. In the non-programming period, however, since the NMOS transistor T14 is ON, the node Fd is discharged and becomes "L". Data of the node Fd is held in the latch circuit 32. Therefore, the fuse data FOUT becomes "H" in the programming period, and "L" in the non-programming period.

The control data storage circuit 6 has an arrangement of the fuse circuit unit A using the above-explained laser fuse, or an arrangement of the fuse circuit unit B using the electric fuse. In an embodiment of the invention, one of features of the control data storage circuit 6 lies in that it is divided into a plurality of groups and respective groups are controlled to be read out at different timings. More specifically, the read control circuit 7 is configured to output read control signals at different timings for respective groups of the control data storage circuit 6.

Explained below are specific embodiments thereof.

Figure 4:
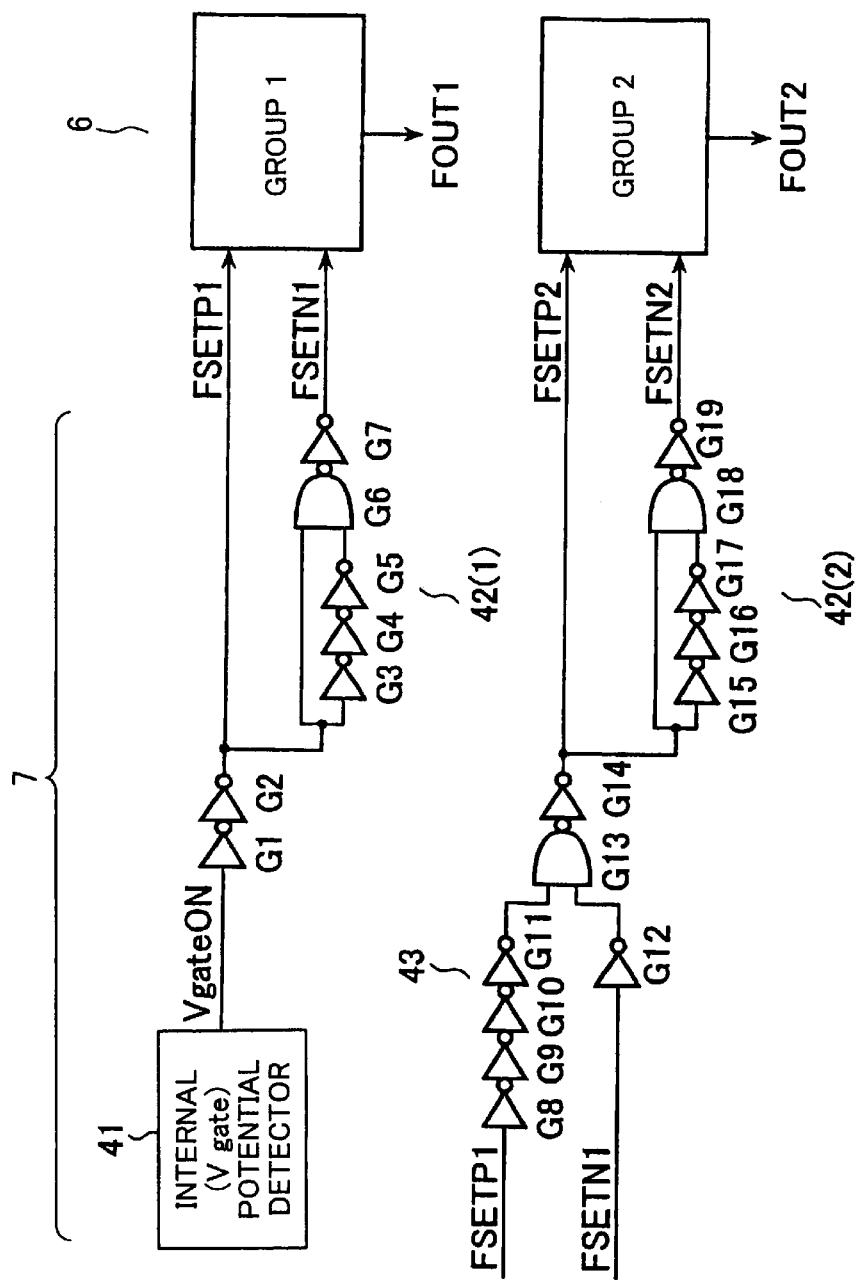
FIG. 4 is a diagram that shows configuration of a control data read-out circuit 7 and a control data storage circuit 6 of FIG. 1.

FIG. 4 shows a configuration of the read control circuit 7 used when the control data storage circuit 6 is divided into two groups 1, 2 to conduct their read control at offset timings. The read control circuit 7, in this example, uses the output VgateON of the internal potential detecting circuit 41 as the basis of the timings. The internal potential detecting circuit 41 is used to detect that the output Vgate of the internal booster circuit, which rises together with the power source potential Vdd upon introduction of the power source, has reached a constant level.

Figure 5:
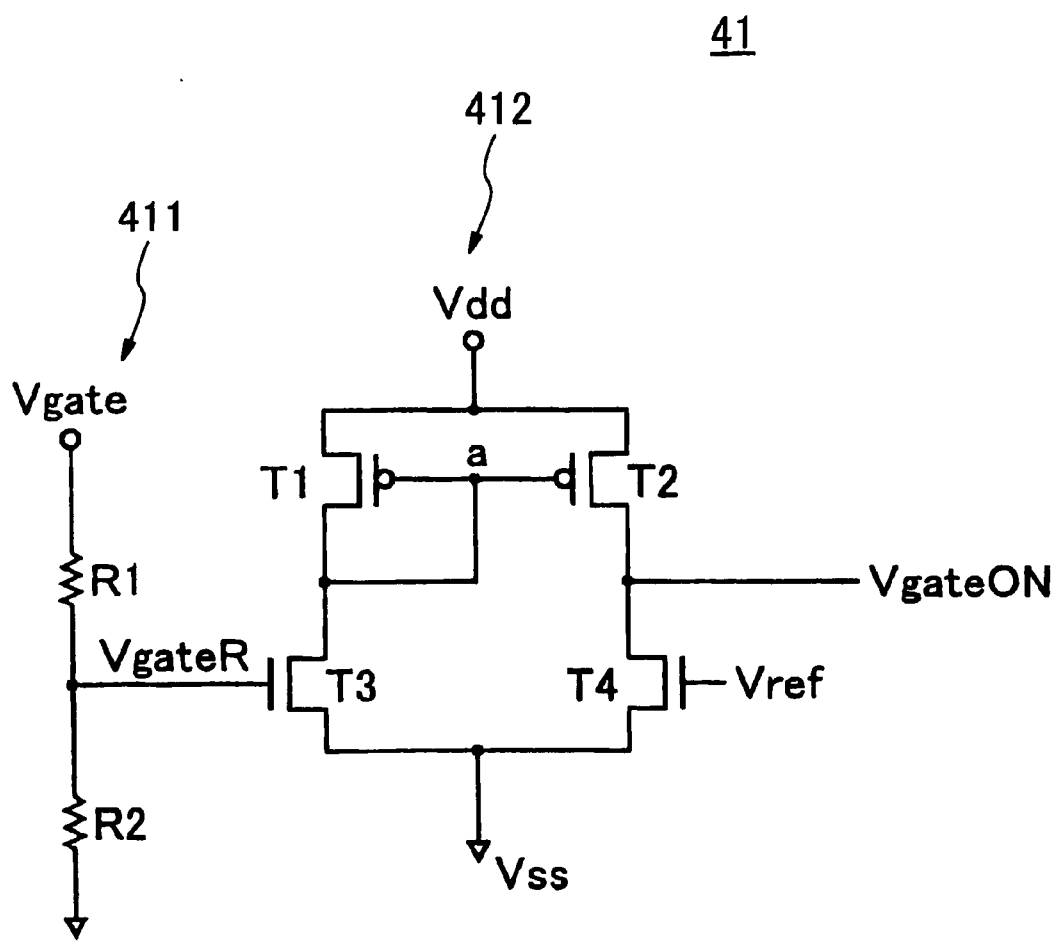
FIG. 5 is a diagram that shows configuration of an internal potential detector circuit 41 of FIG. 4.

The internal potential detecting circuit 41 is made up of, for example as shown in FIG. 5, a voltage divider circuit 411 with resistors R1 and R2 for dividing the output Vgate of the internal booster circuit, and a differential amplifier 412 for detecting the level of the divisional output Vgate R. The differential amplifier 412 is of a type having a PMOS transistor current mirror such that the divisional output VgateR is input to one of gates of a pair of differential NMOS transistors T3 and T4 and a reference voltage Vref is input to the other gate. As a result, when the booster voltage Vgate reaches the constant level, a detection output VgateON is generated.

The read control circuit 7 first uses the output VgateON of the internal potential detecting circuit 41 to generate control signals FSETP1, FSETP2, FSETN1 and FSETN2 for the respective groups 1, 2. The control signal FSETP1 and FSETP2 correspond to the precharging control signal FSETP of the fuse circuit units A and B shown in FIGS. 2 and 3. The control signals FSETN1 and FSETN2 similarly correspond to the read control signal FSETN.

Specifically, by delaying the output VgateON of the internal potential detecting circuit 41 with inverters G1 and G2, the control signal FSETP1 of the group 1 is generated. An edge detecting circuit 42(1), which detects the rising edge of the control signal FSETP1 generates the control signal FSETN1. The edge detecting circuit 42(1) is made up of a chain of inverters G3, G4 and G5 for inverting and delaying the control signal FSETP1, a NAND gate G6 for making the product of the delayed output and the original control signal FSETP1, and an inverter G7 for inverting the output.

Additionally, by inputting the control signals FSET1 and FSETN1 to the delay circuit 43, the control signal FSET2 for the group 2, delayed from the control signal FSET1, is generated. The delay circuit 43 is made up of six stages of gates including four inverters G8 through G11, NAND gate G13 and inverter G14 at the output of the NAND gate G13. The NAND gate G13 is supplied with the control signal FSETN1 via the inverter G12 such that, after the control signal FSETN1 becomes "L", the control signal FSETP2 having a delay corresponding to the six stages of gates relative to the control signal FSET is generated. Further, an edge detecting circuit 42(2) for detecting the rising edge of the control signal FSETP2 generates the read control signal FSETN2 for the group 2.

Figure 6:
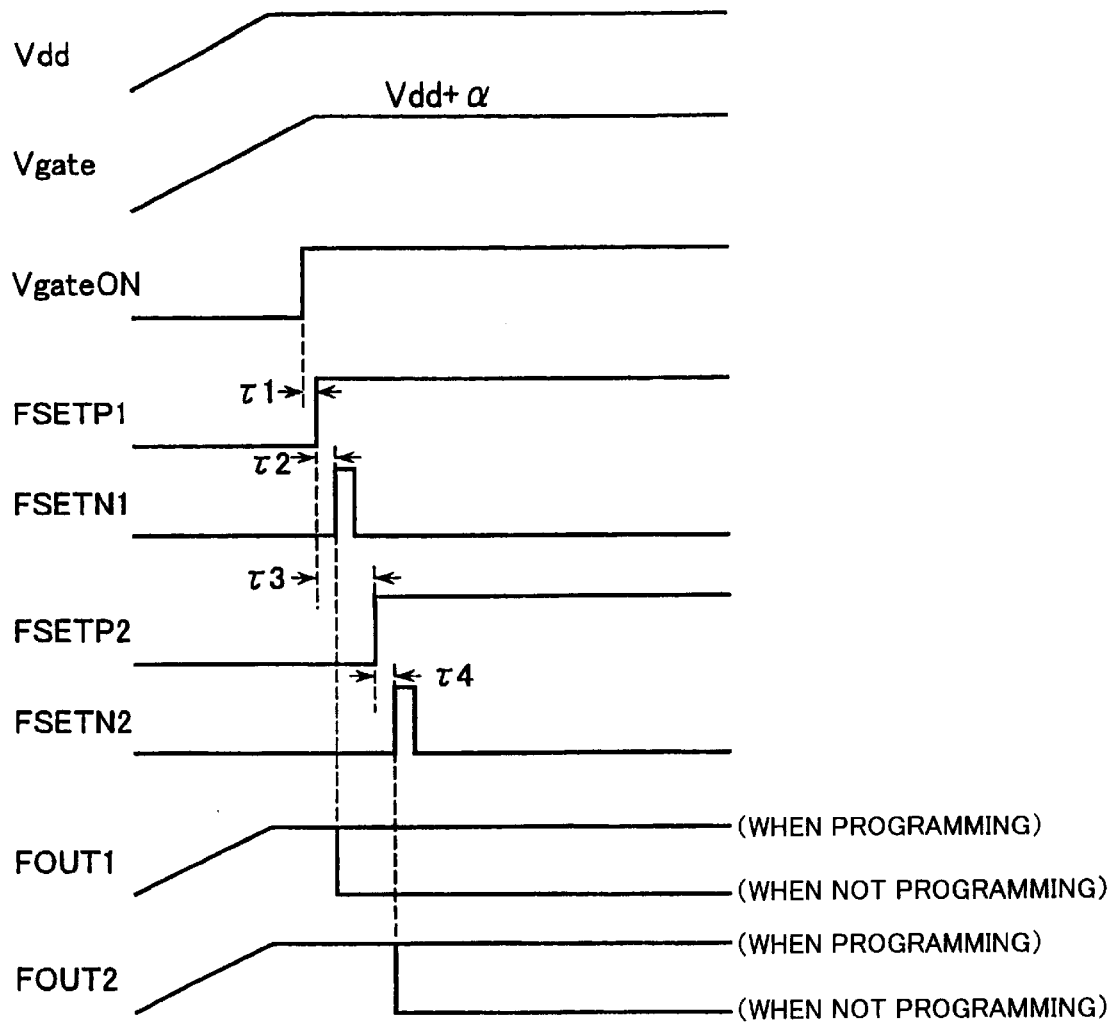
FIG. 6 is a diagram that shows a fuse data read-out waveform of FIG. 4.

FIG. 6 shows waveforms of operations of the read control circuit 7 having the above-explained configuration. As the power source potential Vdd rises, the internal potential Vgate rises. This in due course generates a booster potential Vdd+α(α corresponds to the gate threshold voltage of the NMOS transistor) higher than Vdd. When the internal potential Vgate reaches a predetermined level, in the fuse circuit unit B including the electric fuse shown in FIG. 3, the NMOS transistor T11 connected to the fuse F2 turns ON, and fuse data is read out to the node Fb.

When VgateON becomes "H" as a result of detection by the internal potential detecting circuit 41 that the internal potential Vgate has reached the predetermined level, slightly later therefrom, the control signal FSETP1 for the group 1 becomes "H". The delay time τ1 corresponds to the delay by the inverters G1 and G2. Additionally, by detecting the rising edge of the control signal FSETP1, the control signal FSETN1 is generated. The delay time τ2 until the control signal FSETN1 rises from the control signal FSETP1 corresponds to the delay of the inverters G3 through G5, NAND gate G6 and inverter G7.

In the group 1 of the control data storage circuit 6, if it is made up of the fuse circuit unit A of FIG. 2, the node Fa is precharged in the "L" period of the control signal the control signal FSETP1 becomes "H", thereby to complete the precharging operation. Subsequently, the control signal FSETN1 becomes "H", and the fuse data is transferred to the latch circuit 21. Also when the circuit is made of the fuse circuit unit B of FIG. 3, the circuit operates in substantially the same manner, namely, the node Fd is precharged in the "L" period of the control signal FSETP1, the control signal FSETP1 becomes "H", thereby to complete the precharging operation, the control signal FSETN1 next becomes "H", and fuse data is transferred to the latch circuit 32.

With a delay of time τ3 from the control signal FSETP1, the control signal FSETF2 for the group 2 becomes "H". This delay time τ3 corresponds to six stages of gates of the delay circuit 43. Therefore, even after completion of the precharge in the group 1, the precharge operation of the group 2 continues until the control signal FSETF2 becomes "H". Then, by detection of the rising edge of the control signal FSETF2, the control signal FSETN2 is generated after a delay of time τ4. By these control signals FSETF2 and FSETN2, fuse data is read out in the group 2.

As explained above, by reading out data from individual groups of the control data storage circuit 6 divided into such groups at slightly different timings for respective groups, even when the control data storage circuit 6 has large capacity, the fuse data read-out current is dispersed, and this result in suppressing the power consumption peak. In case the groups are made of the same number of fuse circuit units, the maximum power consumption is reduced to ½.

Grouping of the control data storage circuit 6 is appropriately determined depending on the purpose of use of the control data. For example, operation mode setting data such as data for adjusting the internal voltage of the chip, in the group 1, data for adjusting the timing, and so on, may be stored in the group 1, and data for judging defective addresses for redundancy may be stored in the group 1. Alternatively, in case the control data storage circuit 6 is disposed in right-and-left or up-and-down divisional areas of a chip, the divisional parts may be directly used as the groups 1 and 2. Furthermore, in case the control data storage circuit 6 includes a part made of the fuse circuit unit A using a laser fuse and a part made of the fuse circuit unit B using the electric fuse, the circuit may be divided into groups 1, 2 within the same range as those component elements.

Figure 7:
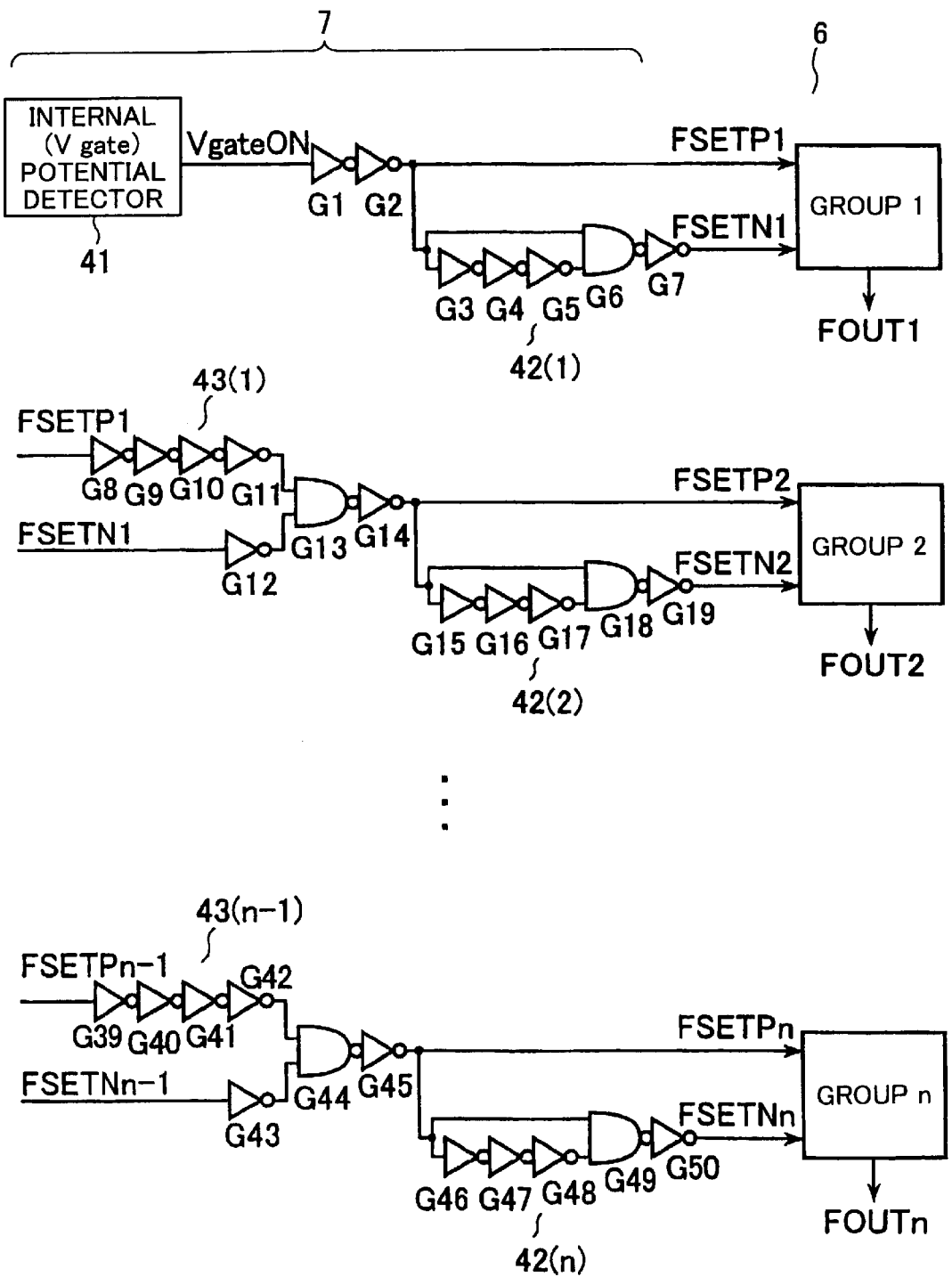
FIG. 7 is a diagram that shows another configuration of the control data read-out circuit 7 and the control data storage circuit 6 of FIG. 1.

Although FIG. 4 shows the example dividing the control data storage circuit 6 into two groups, the circuit may be divided into n groups 1, 2, . . . , n not less than two as shown in FIG. 7. The relationship between FIGS. 9, 12, 14, 16, 17, 18 and 20 and FIGS. 9k 12k 14A, 16A, 17k 18A and 20A are similar to the above.

The principle of this configuration of the read control circuit 7 shown here is the same as that of FIG. 4. That is, based on the control signals FSETP1, FSETN1 for the group 1, the control signals FSETF2, FSBTN2 for the group 2, delayed therefrom by a predetermined time, may be generated, and such control signals may be generated sequentially with slight delays, respectively.

Figure 8:
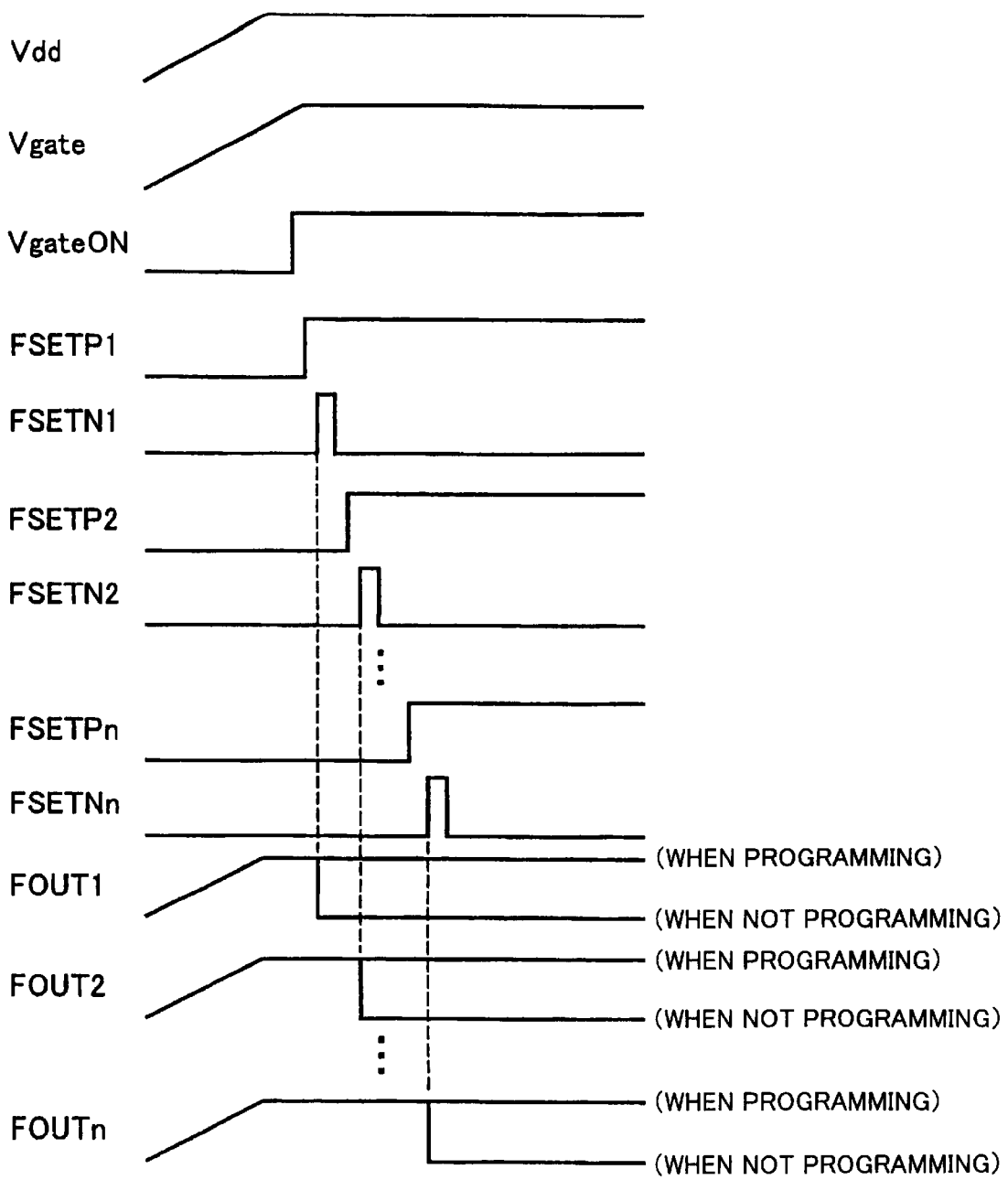
FIG. 8 is a diagram that shows a fuse data read-out waveform of FIG. 7.

Waveforms of the read control circuit having such configuration are shown in FIG. 8. Although not explained in detail, fuse data is read out of the respective groups 1, 2, . . . , n by the control signals FSETN1, FSETN2, . . . , FSETNn at timings delayed little by little. Therefore, the maximum power consumption upon reading fuse data is reduced to 1/n.

Figure 9:
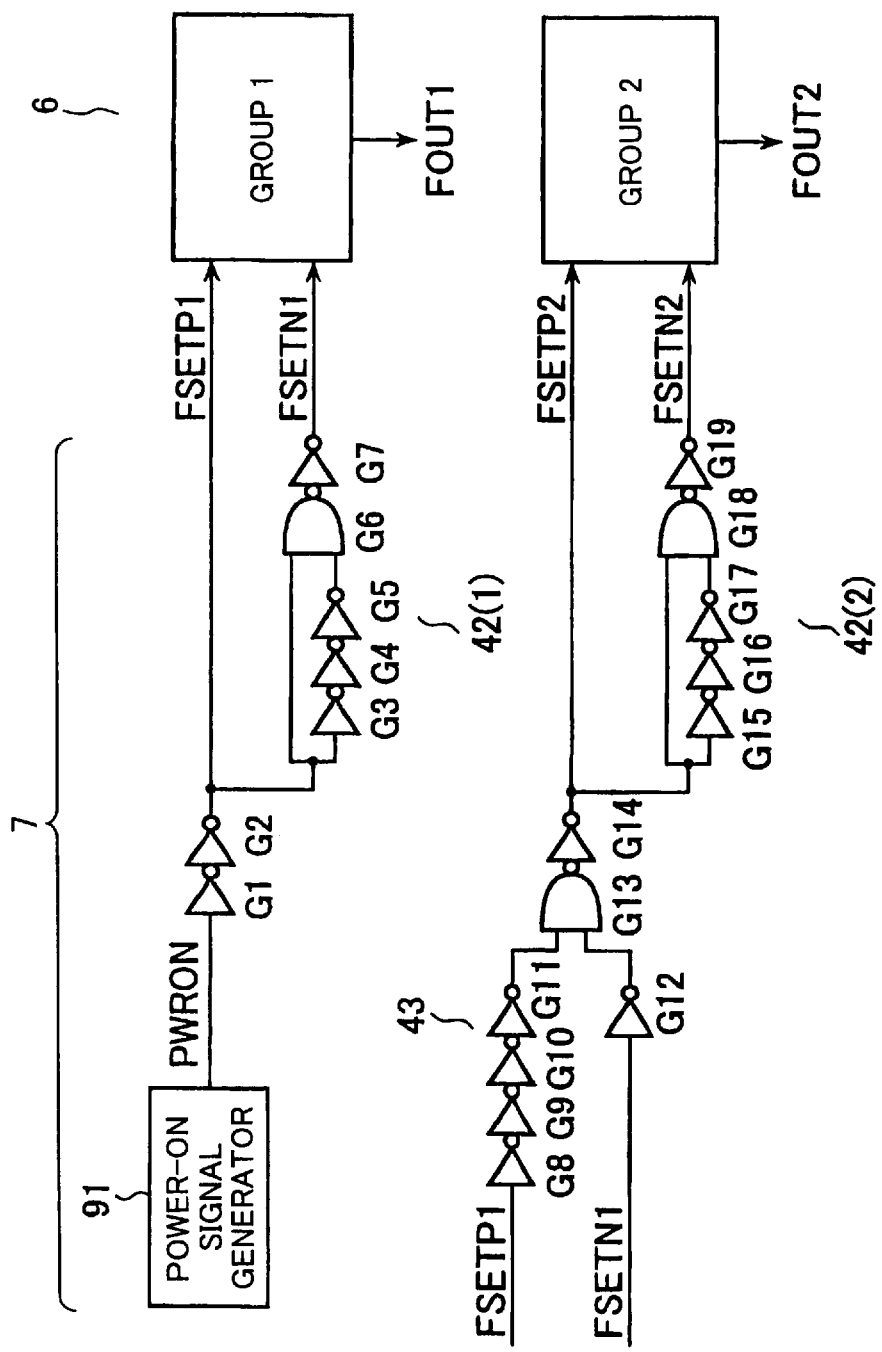
FIGS. 9 and 9A are diagrams that show further configuration of the control data read-out circuit 7 and the control data storage circuit 6 of FIG. 1.
Figure 9A:
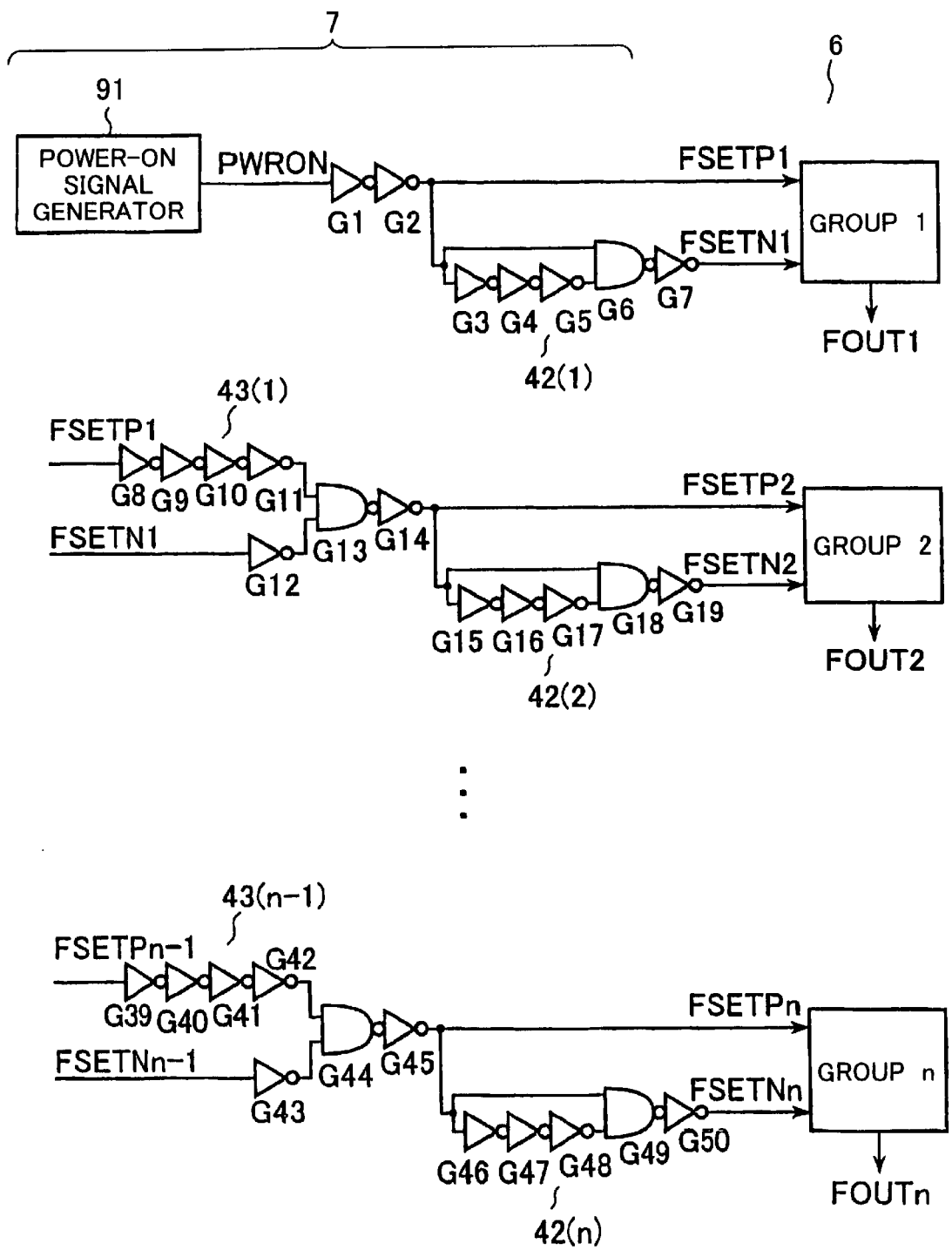

FIGS. 9 and 9A each show a configuration of the read control circuit 7 according to another embodiment, in which the control data storage circuit 6 is divided into two groups 1 and 2. They are different from FIG. 4 in using an output signal PWRON of a power-on signal generating circuit 91 as the timing reference of control signals, and in the other respects, the configurations of FIGS. 9 and 9A are the same as FIG. 4.

Figure 10:
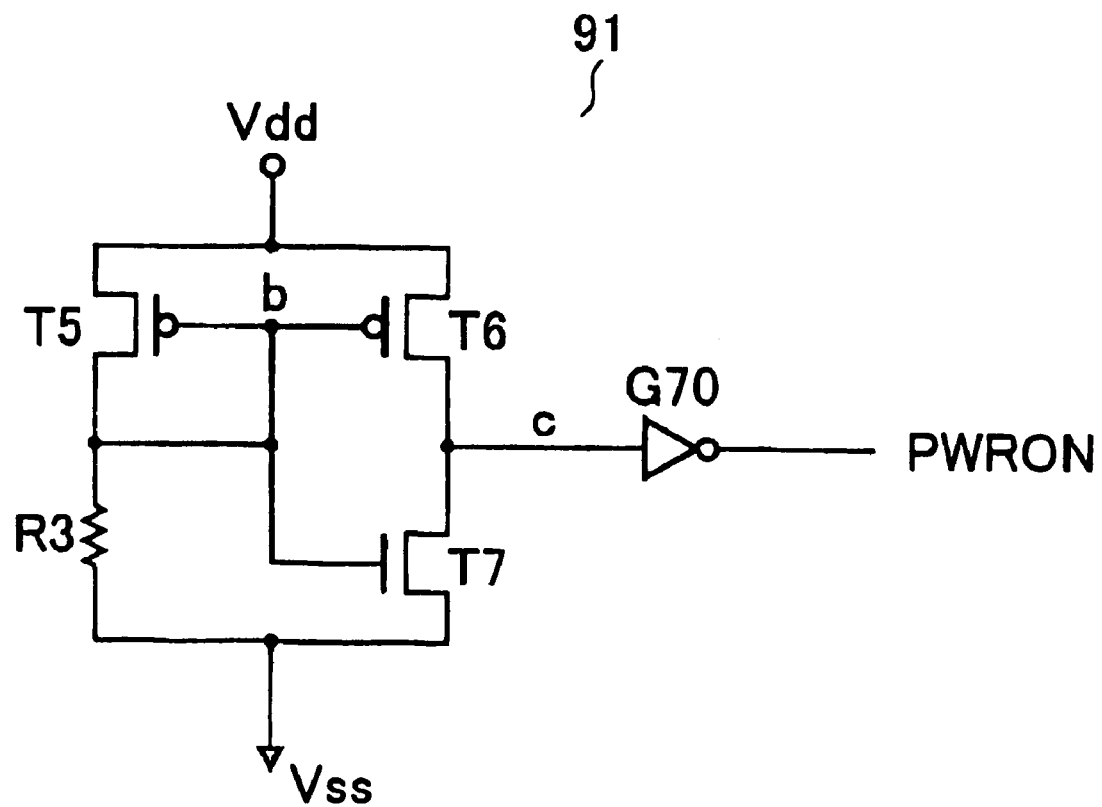
FIG. 10 is a diagram that show configuration of a power-on signal generating circuit 91 of FIG. 9.

The power-on signal generating circuit 91 detects that the power source voltage has reached a predetermined level upon introduction of the power source, and it is configures as shown in FIG. 10, for example. Sources of PMOS transistors T5, T6, which form a current mirror, are commonly connected to the power source terminal, the gate/drain of the transistor T5 is grounded through a resistor R3, and the drain of the transistor T6 is grounded through an NMOS transistor T7. The gate of the NMOS transistor T7 is in common connection with the gates of the PMOS transistors T5, T6.

In the configuration of this type, when the power source potential Vdd rises, while it remains at low values, the transistor T7 is OFF, the transistors T5, T7 are ON, and the nodes b, c similarly rise in potential. Once the potential of the node b rises beyond the threshold voltage of the transistor T7, the transistor T7 turns ON, and a power-on signal PWRON of the "H" level is generated.

Figure 11:
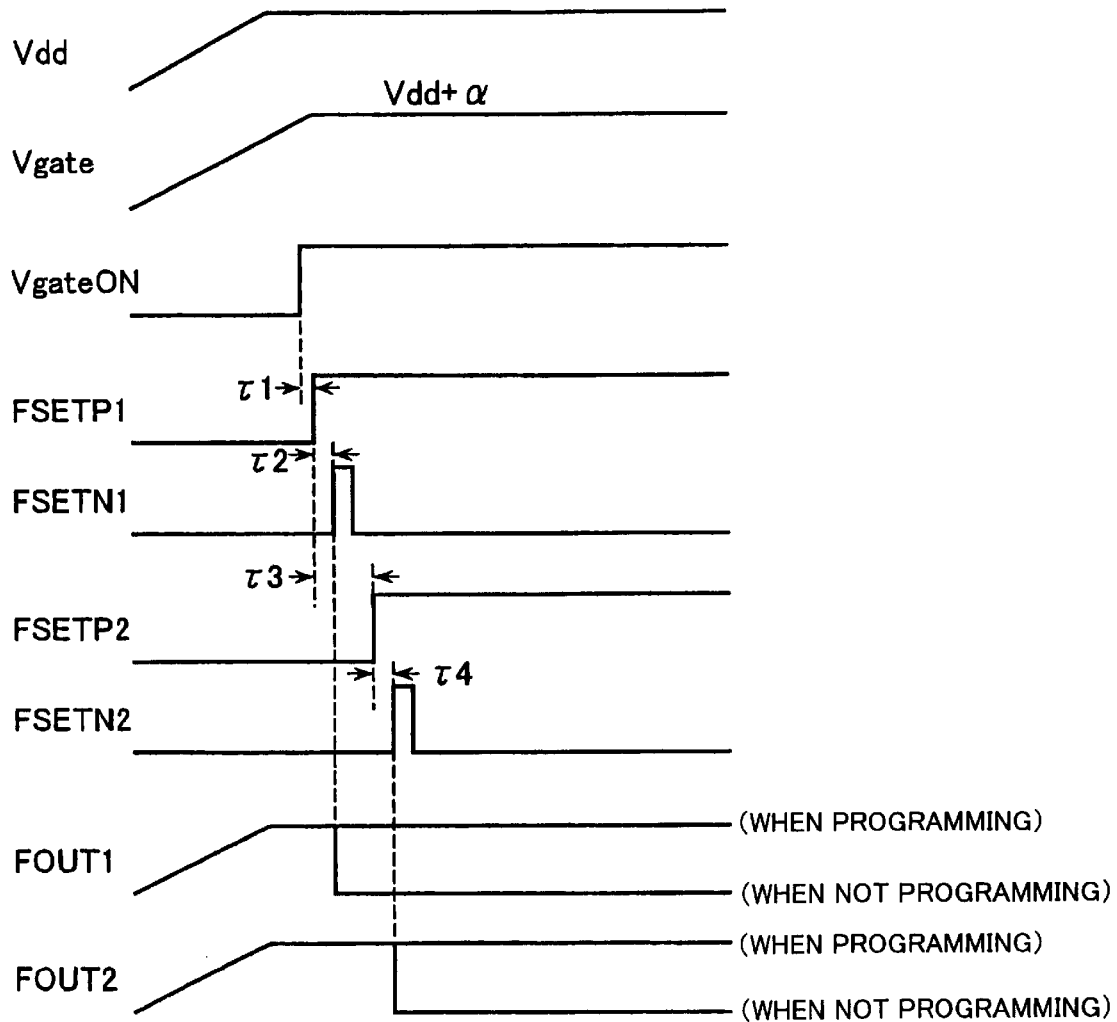
FIG. 11 is a diagram that shows a fuse data read-out waveform of FIG. 9.

Based on the output PWRON of the power-on signal generating circuit 91, the read control circuit 7 of FIG. 9 or 9A generates control signals FSETP1, FSETN1, FSETP2 and FSETN2 for the groups 1, 2, respectively, similarly to he foregoing embodiment. Waveforms of responsive operations of the control data storage circuit 6 are shown in FIG. 11. Here again, fuse data is read out from the respective groups 1, 2 by the read control signals FSETN1 and FSETN2 generated with a predetermined delay.

Therefore, similarly to the foregoing embodiment, the current consumed upon reading fuse data is dispersed, and the maximum power consumption is limited.

Figure 12:
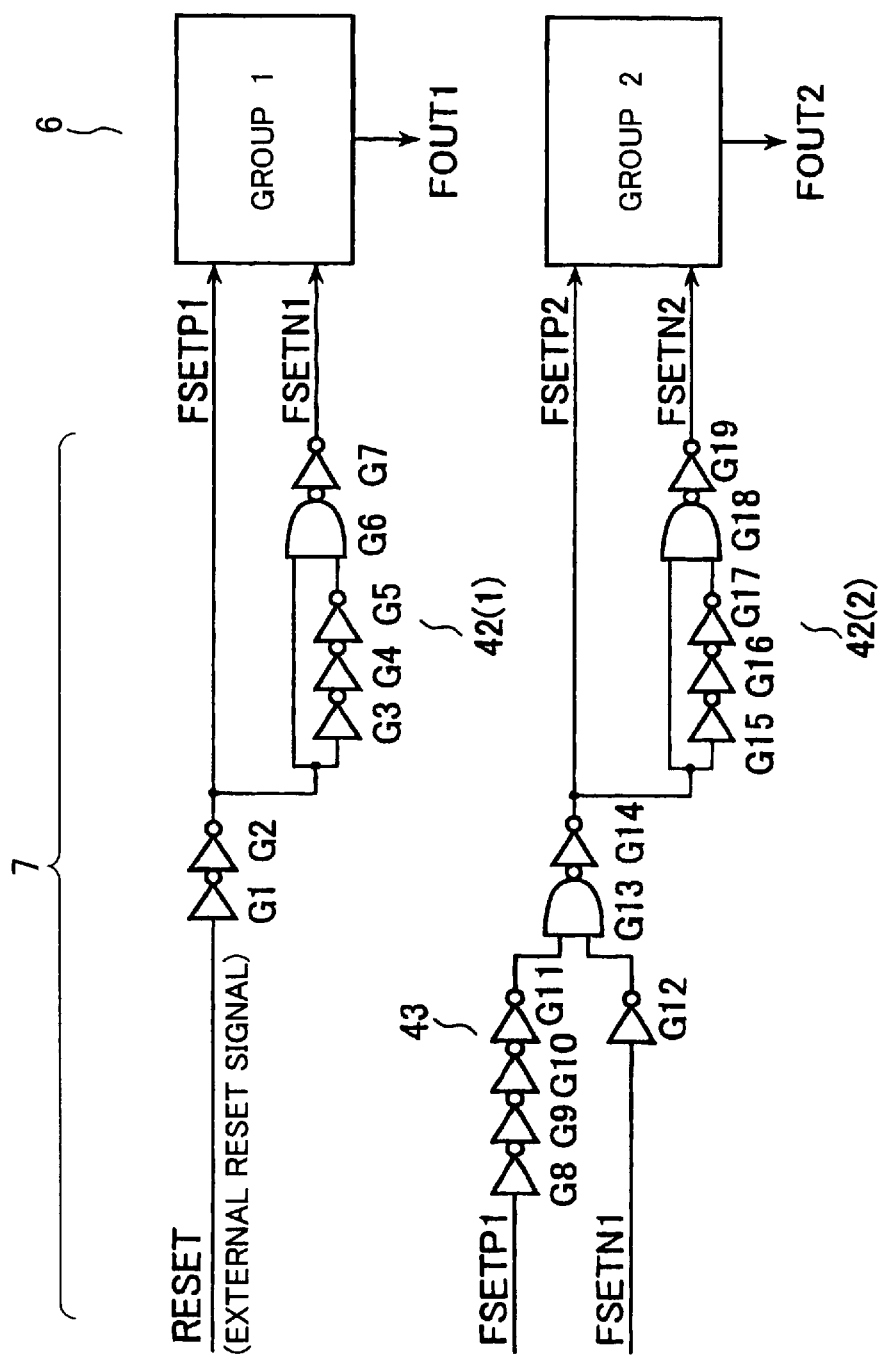
FIGS. 12 and 12A are diagrams that show further configurations of the control data read-out circuit 7 and the control data storage circuit 6 of FIG. 1.
Figure 12A:
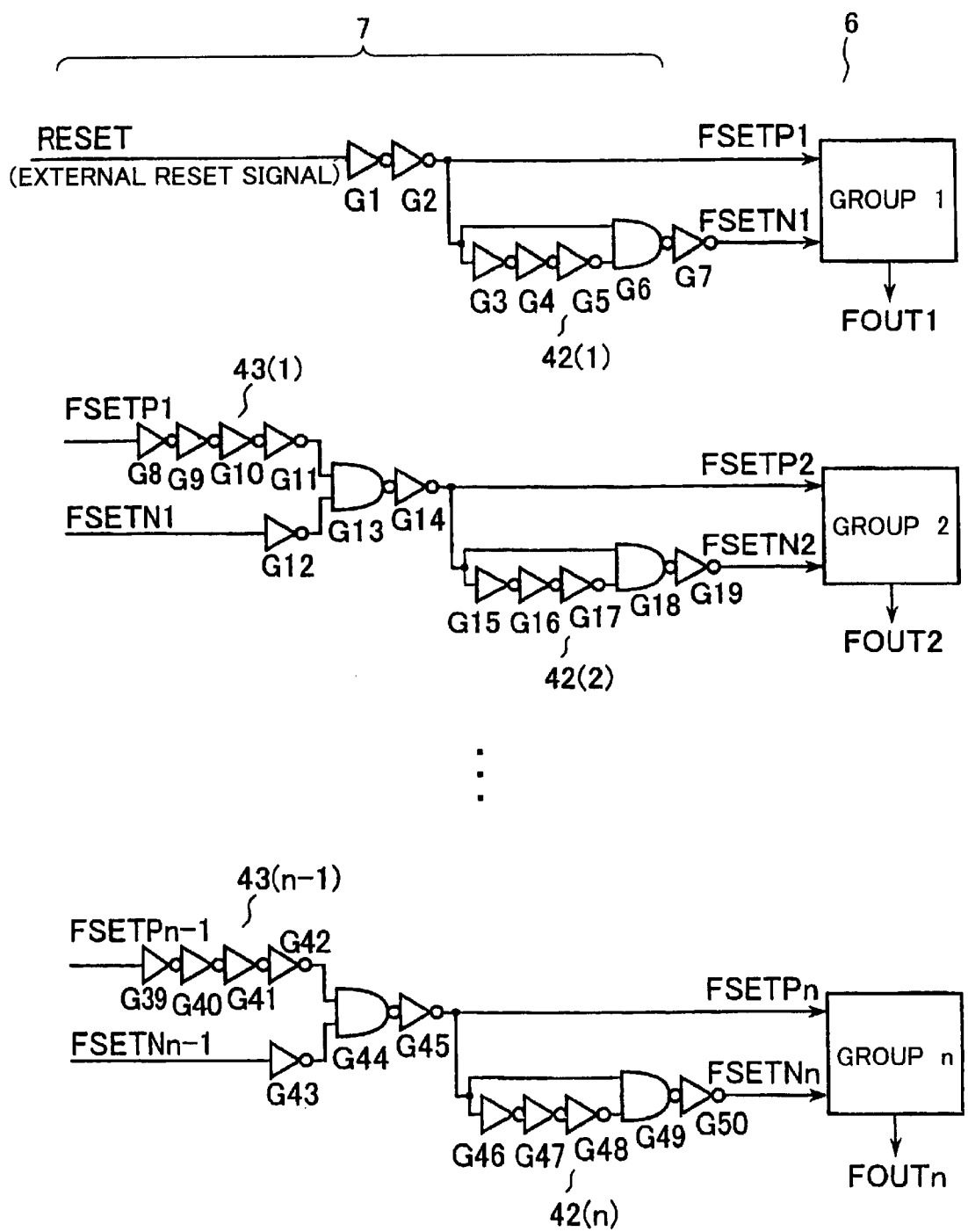

FIGS. 12 and 12A each show a configuration of the read control circuit 7 according to a further embodiment, in which the control data storage circuit 6 is divided into two groups 1, 2. They are different from FIG. 4 in using an externally supplied reset signal RESET as the timing reference of control signals, and in the other respects, the configurations of FIGS. 12 and 12A are the same as FIG. 4. The reset signal RESET is input in form of a command, or the like, for the purpose of, for example, initialization of an interface circuit for interface with the exterior.

Figure 13:
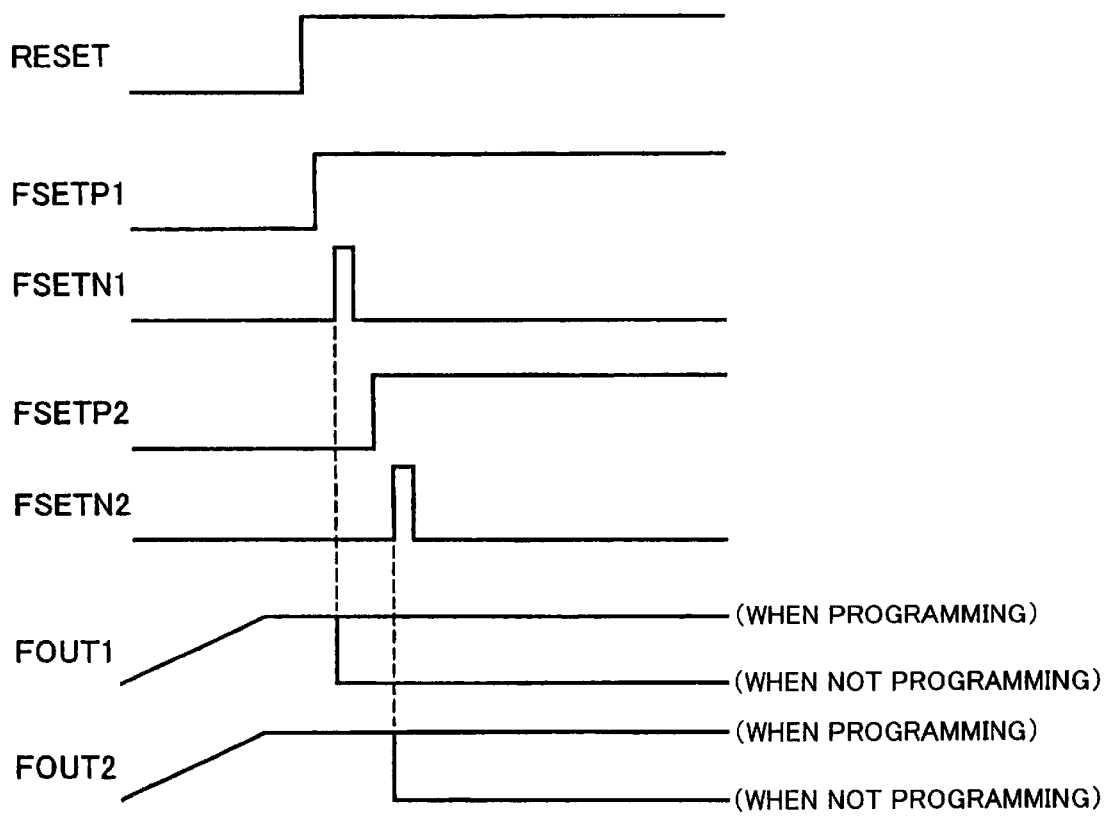
FIG. 13 is a diagram that shows a fuse data read-out waveform of FIG. 12.

More specifically, using the reset signal RESET as the timing reference, here are generated control signals FSETP1, FSETN1, FSETP2 and FSETN2 for the groups 1, 2, respectively, similarly to the foregoing embodiments. Waveforms of responsive operations of the control data storage circuit 6 are shown in FIG. 13. Here again, fuse data is read out from the respective groups 1, 2 by the read control signals FSETN1 and FSETN2 generated with a predetermined delay.

Therefore, similarly to the foregoing embodiments, the current consumed upon reading fuse data is dispersed, and the maximum power consumption is limited.

Figure 14:
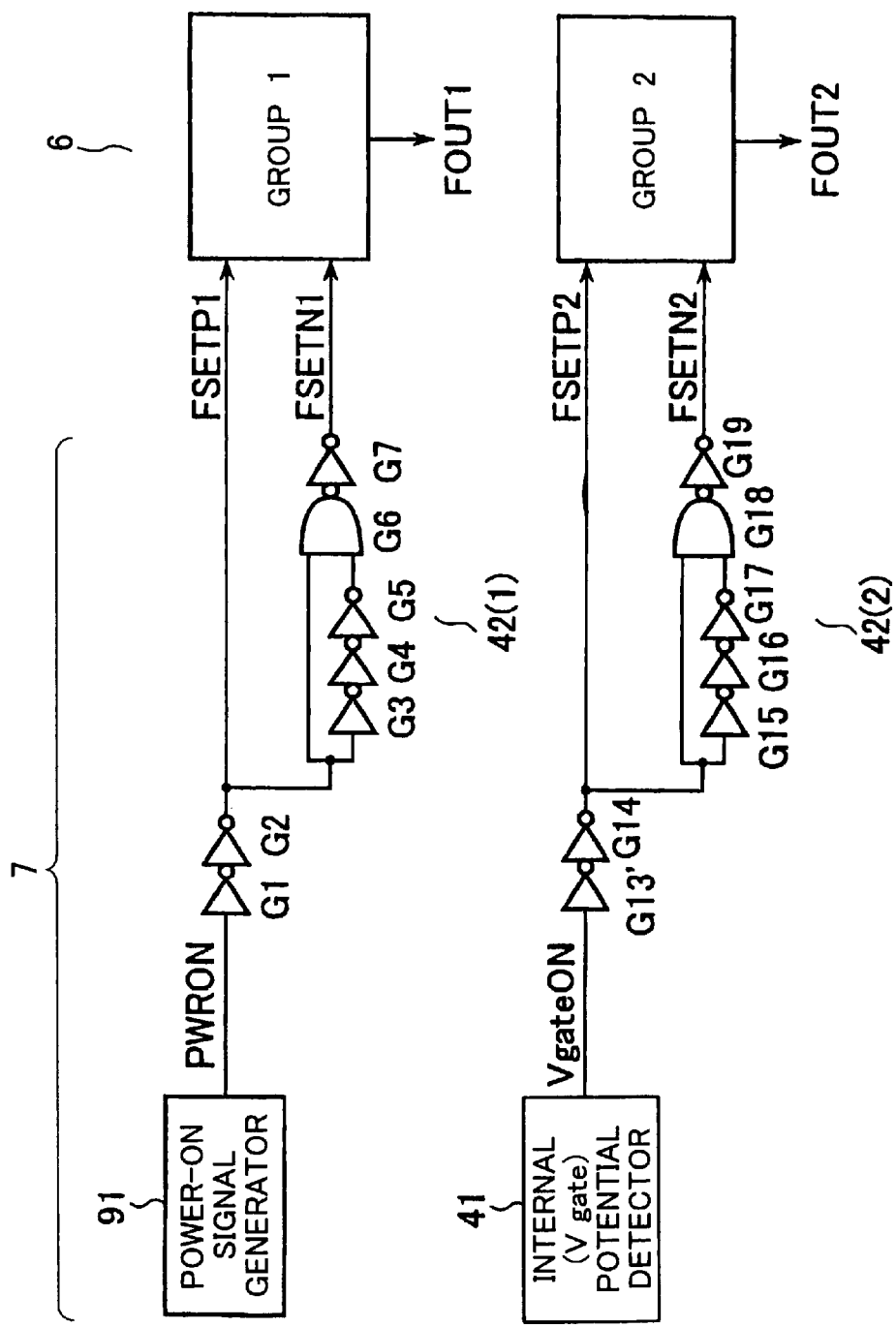
FIGS. 14 and 14A are diagrams that show further configuration of the control data read-out circuit 7 and the control data storage circuit 6 of FIG. 1.
Figure 14A:
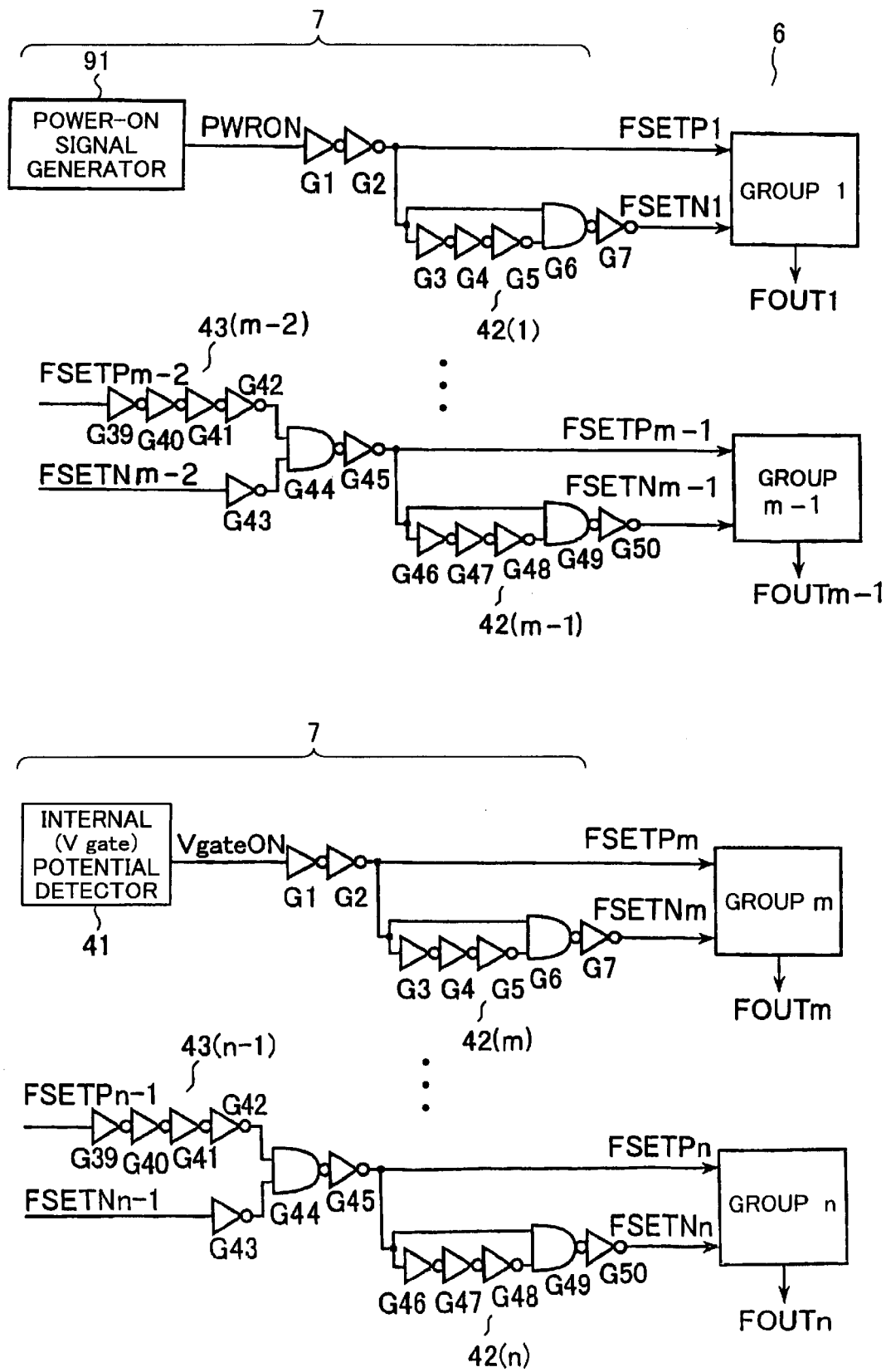

FIGS. 14 and 14A each show a configuration of the read control circuit 7 according to a still further embodiment, in which the control data storage circuit 6 is divided into two groups 1, 2. In this embodiment, the output PWRON of the power-on signal generating circuit 91 as the timing reference signal of control signals for the group 1, similarly to the embodiment of FIG. 9 or 9A, and the output VgateON of the internal potential detecting circuit 41 is used as the timing reference signal of control signals for the group 2, similarly to the embodiment of FIG. 4.

More specifically, by delaying the output PWRON of the power-on signal generating circuit 91 with inverters G90, G91, the control signal FSETP1 is generated, and by detecting its rising edge with the edge detecting circuit 42(1), the control signal FSETN1 is generated. Independently from them, the output VgateON of the internal potential detecting circuit 41 is delayed with inverters G97, G98, the control signal FSETP2 is generated, and by detecting the rising edge of the edge detecting circuit 42(2), the control signal FSETN2 is generated.

Figure 15:
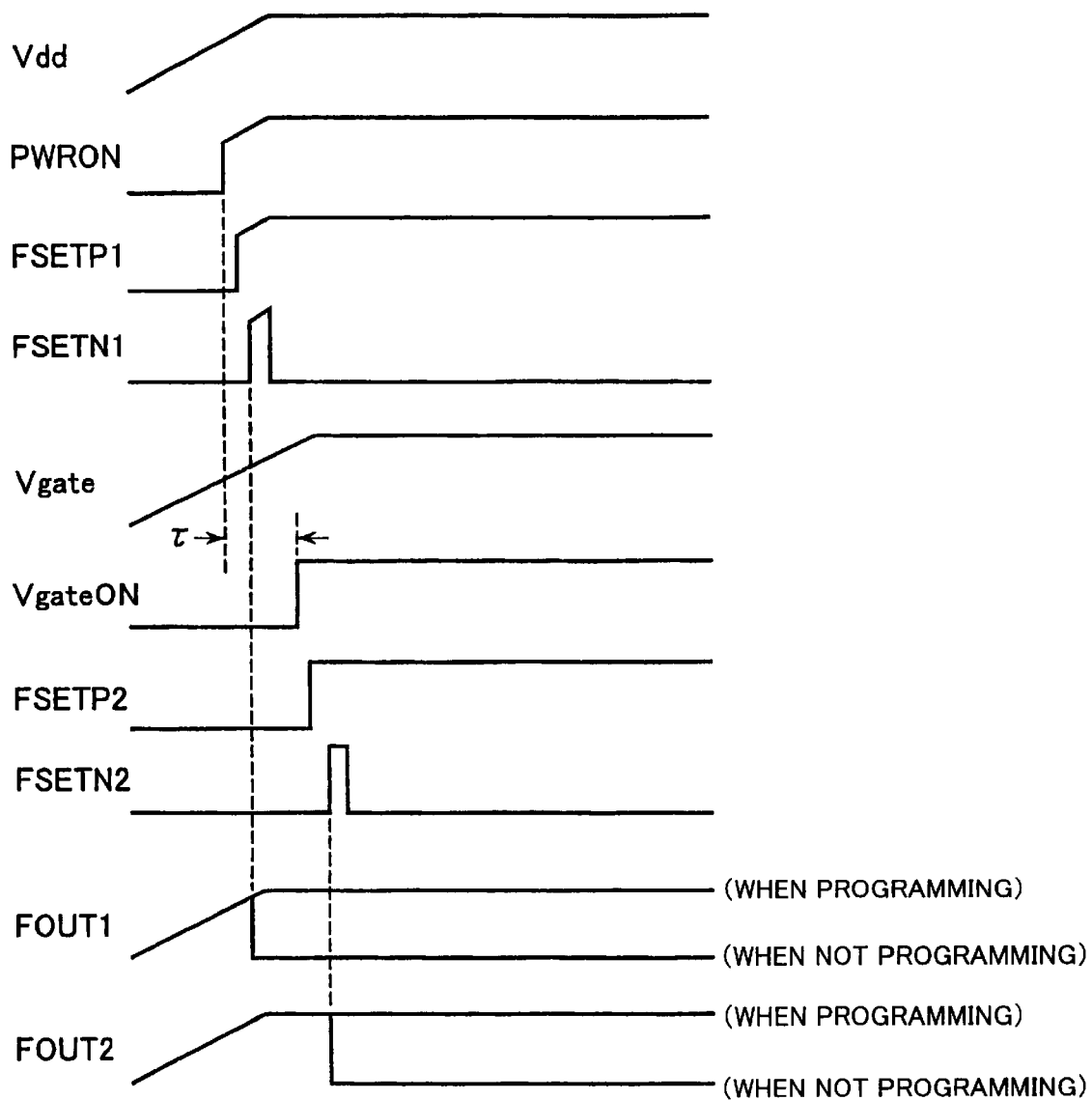
FIG. 15 is a diagram that shows a fuse data read-out waveform of FIG. 14.

Waveforms of responsive operations of the control data storage circuit 6 are shown in FIG. 15. If the power-on signal PWRON and the internal potential detecting signal VgateON are generated with a time difference $\tau$, then read operations of fuse data of the respective groups 1, 2 are also sequentially effected with each delay time $\tau 0$ by the read control signals FSETN1, FSETN2 based on those signals PWRON and VgateON.

Therefore, similarly to the foregoing embodiments, the current consumed upon reading fuse data is dispersed, and the maximum power consumption is limited.

Figure 16:
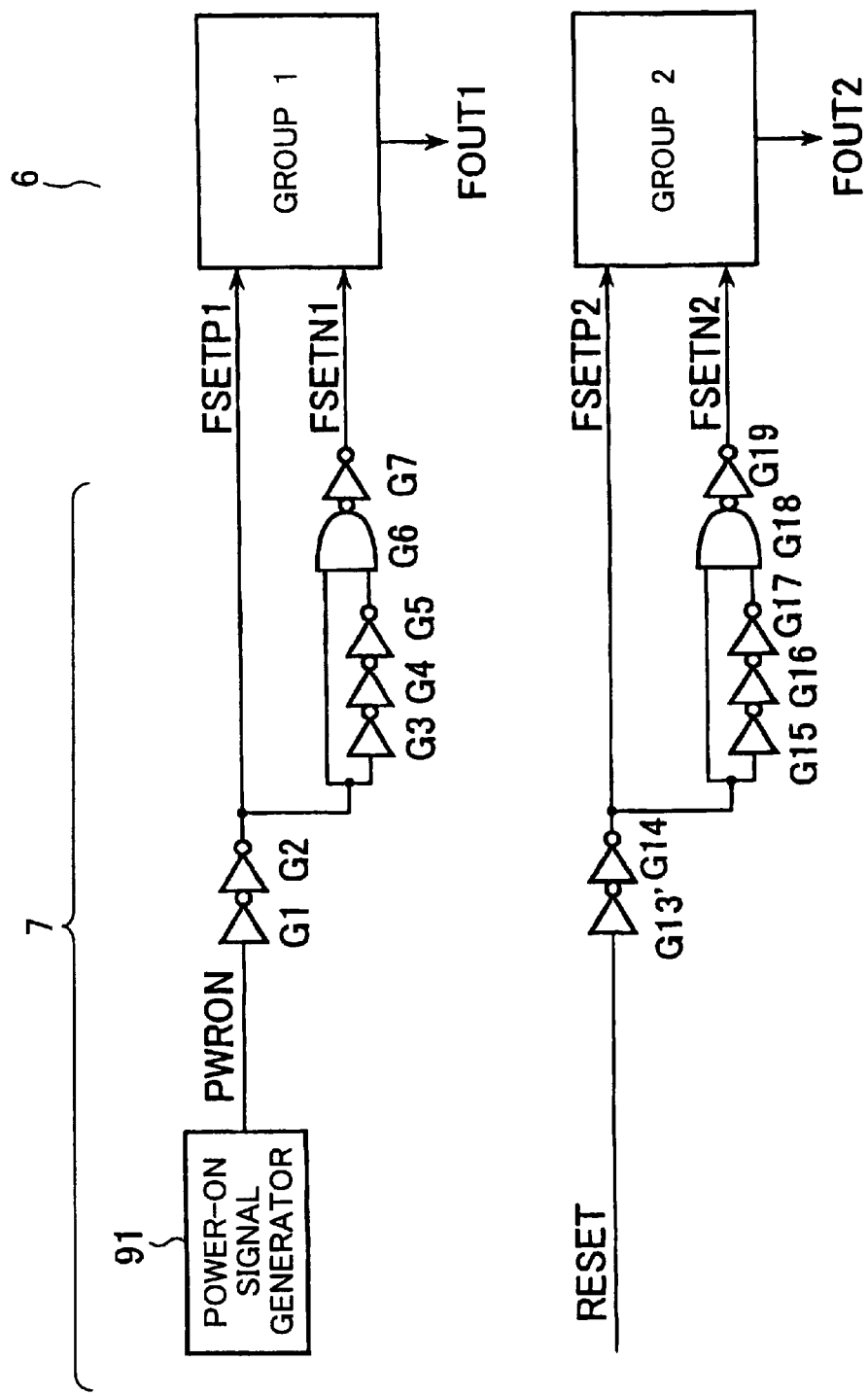
FIGS. 16 and 16A are diagrams that show further configurations of the control data read-out circuit 7 and the control data storage circuit 6 of FIG. 1.
Figure 16A:
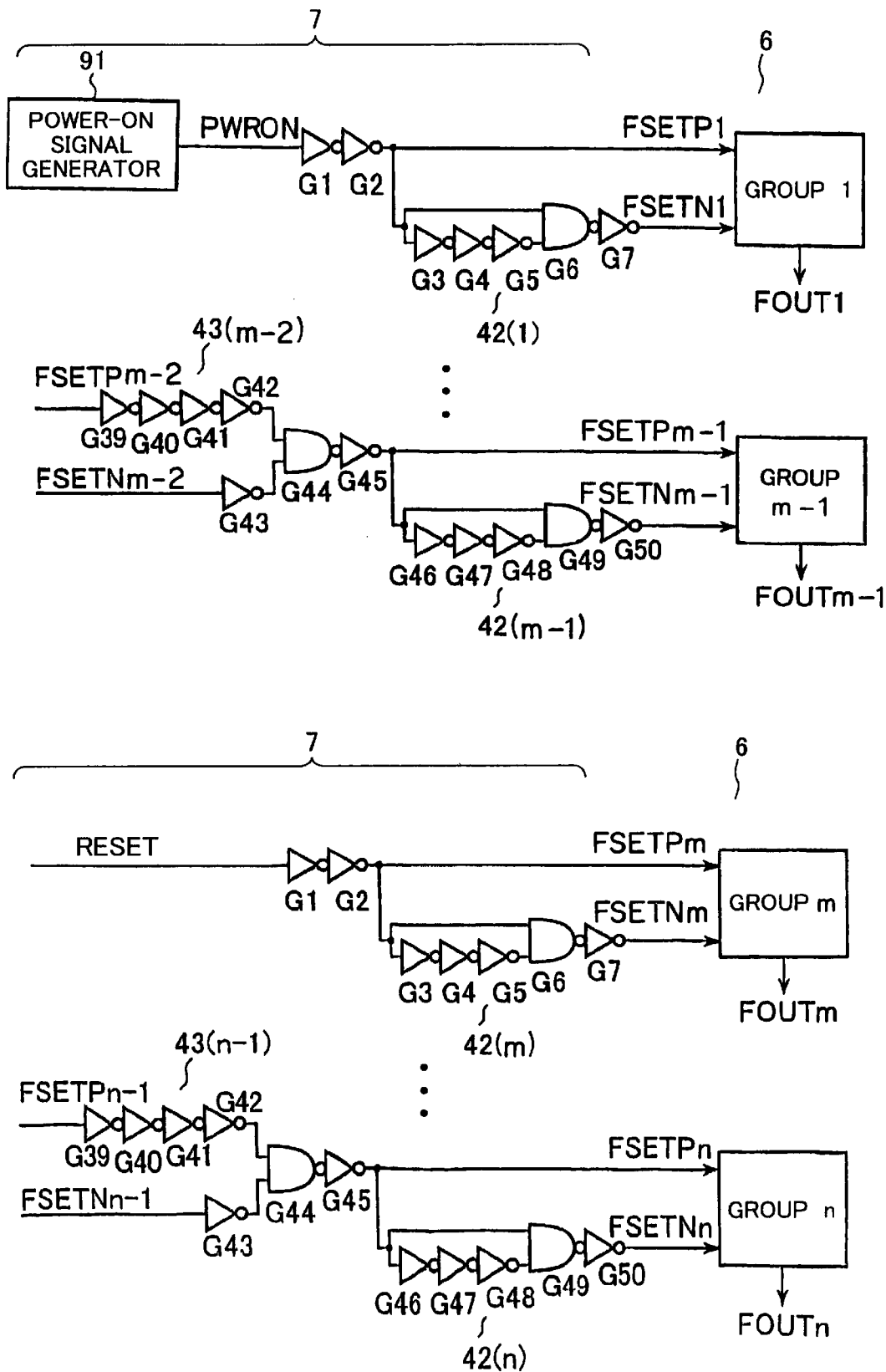

FIGS. 16 and 16A each show an example in which the output PWRON of the power-on signal generating circuit 91 as the timing reference signal of control signals for one of the groups 1 and 2 whereas the external reset signal RESET is used as the timing reference signal of control signals for the other group.

Figure 17:
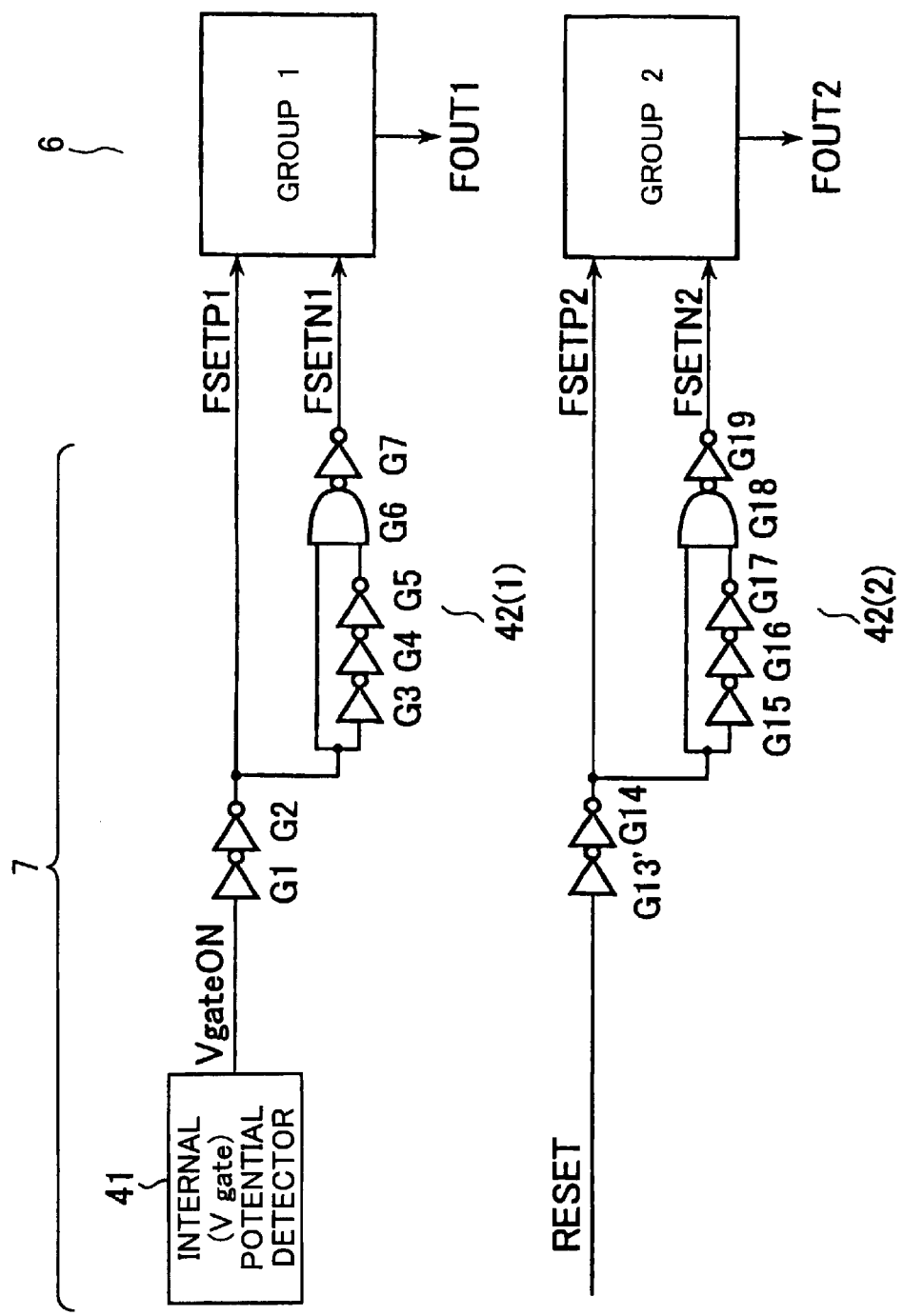
FIGS. 17 and 17A are diagrams that show further configurations of the control data read-out circuit 7 and the control data storage circuit 6 of FIG. 1.
Figure 17A:
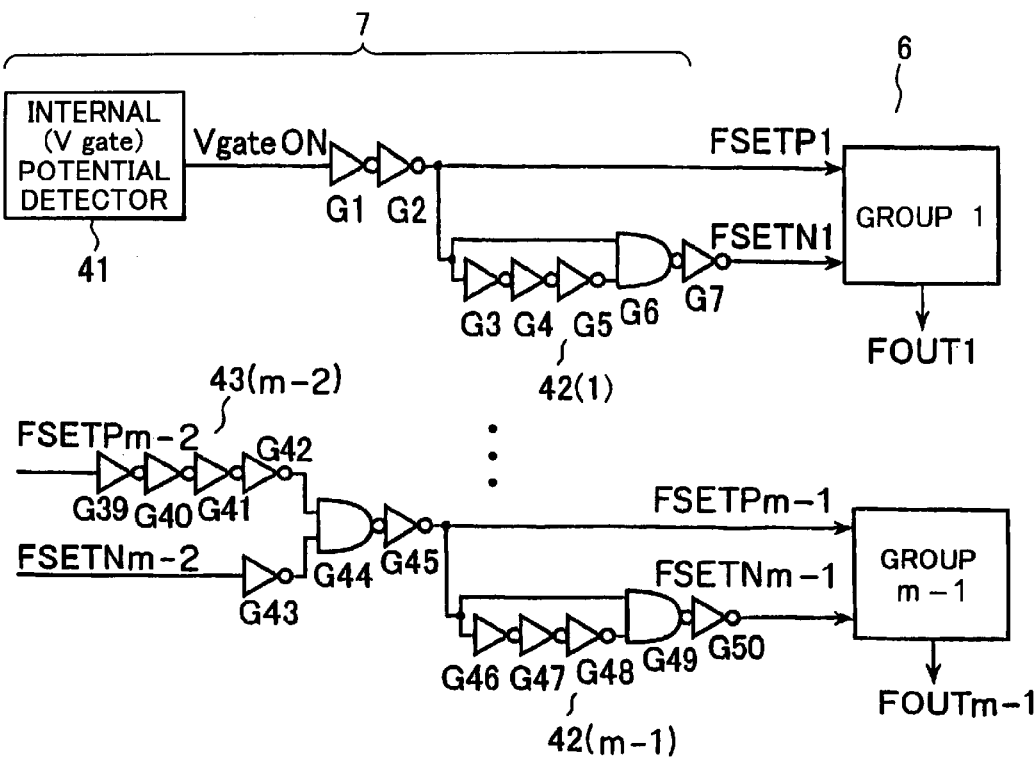
Figure 17A:
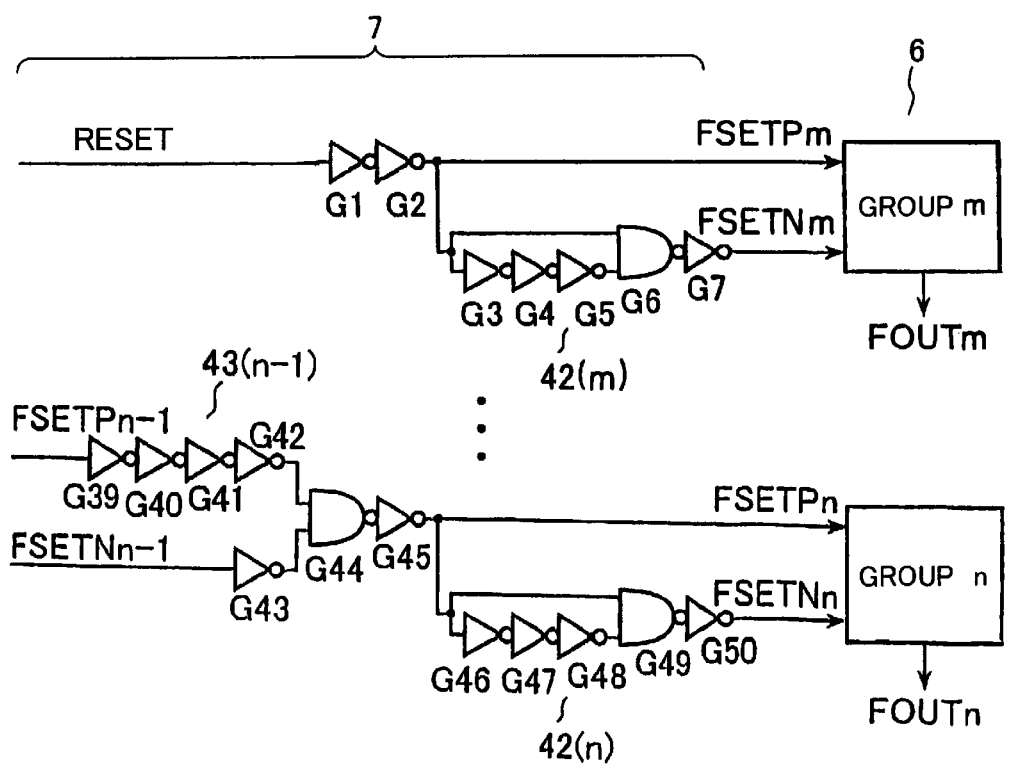

FIGS. 17 and 17A each show an example in which the output VgateON of the internal potential detecting circuit 41 is used as the timing reference signal of control signals for the group 1 whereas the external reset signal RESET is used as the timing reference signal of control signals for the group 2.

The control signal generating circuit is the same as that of FIG. 14 or 14A, and details including waveforms of operations are not explained here. Also in these examples, only if there is a difference in rising timing between the power-on signal PWRON and the reset signal RESET, or between the internal potential detecting signal VgateON and the reset signal RESET, control signals similar to those of FIG. 14 or 14A can be generated, and read operations can be executed at different timings for the groups 1, 2.

Here again, similarly to the foregoing embodiments, the current consumed upon reading fuse data is dispersed, and the maximum power consumption is limited.

Figure 18:
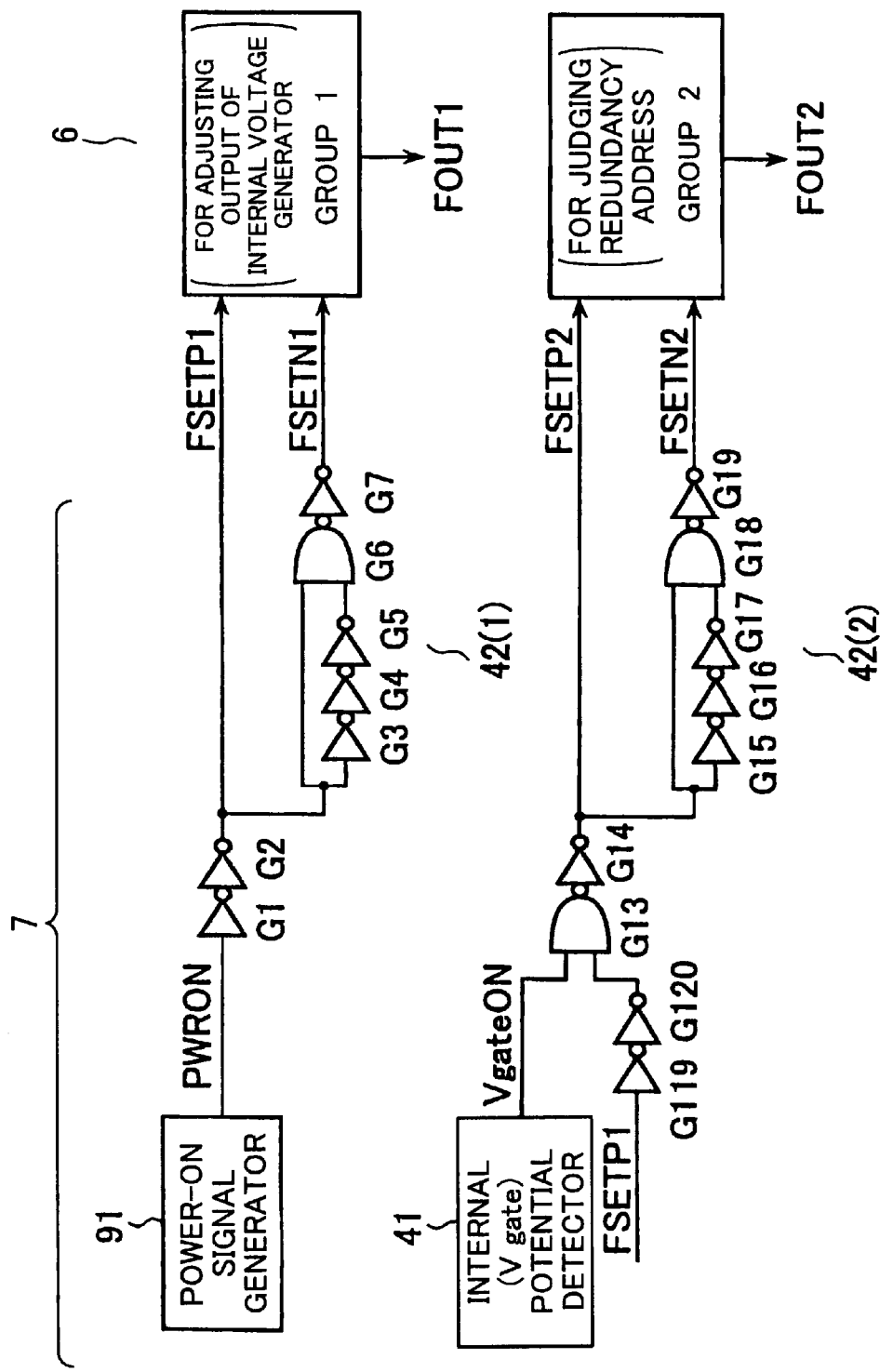
FIGS. 18 and 18A are diagrams that show further configurations of the control data read-out circuit 7 and the control data storage circuit 6 of FIG. 1.
Figure 18A:
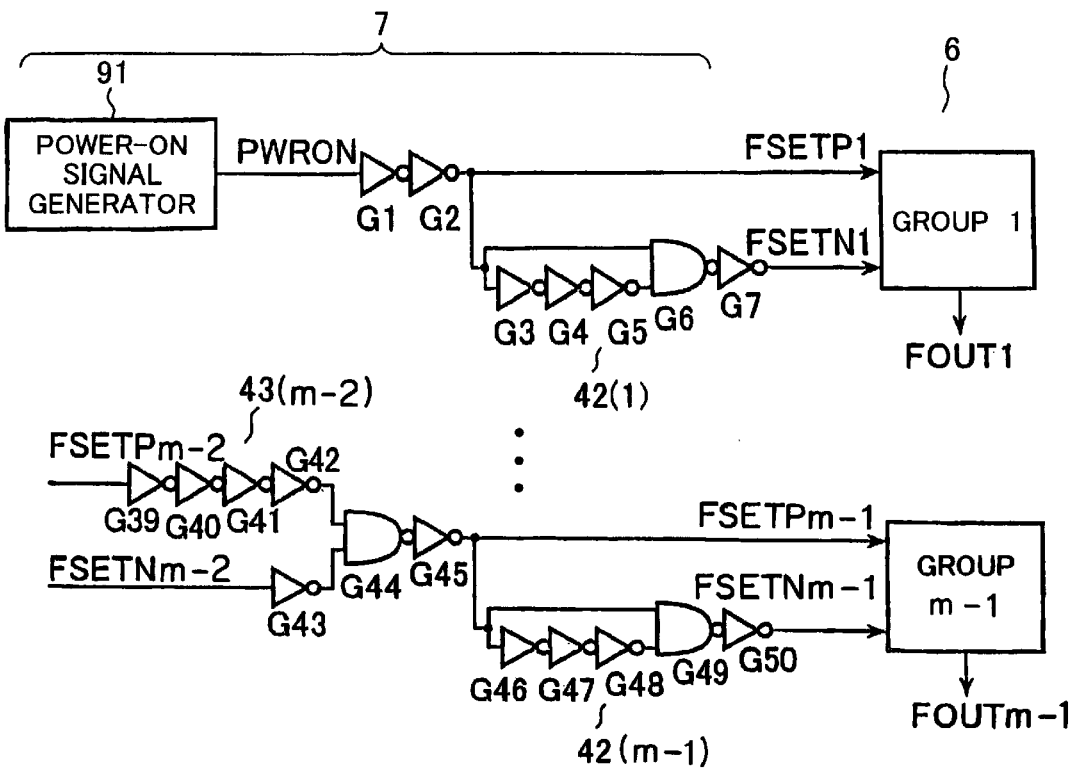
Figure 18A:
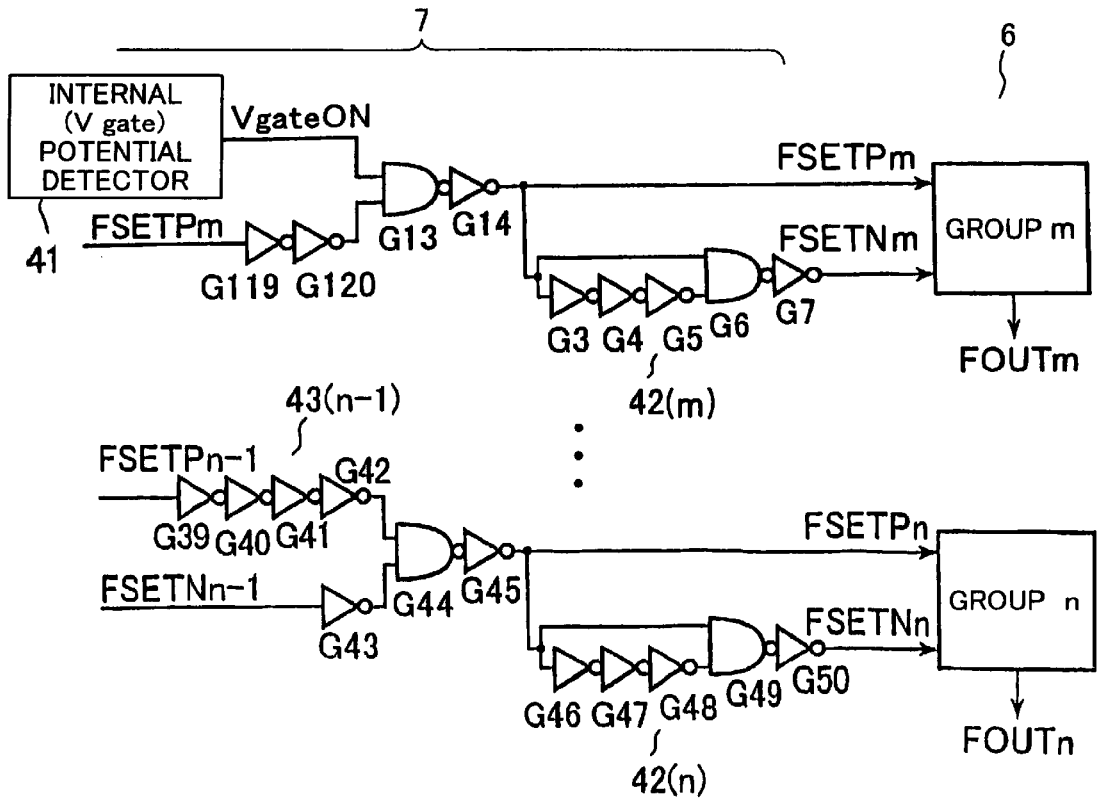

FIGS. 18 and 18A each show an embodiment improved from the embodiment of FIG. 14 or 14A. The group 1 of the control data storage circuit 6 functions to store output adjusting data of the internal voltage generating circuit, and let it be made up of the fuse circuit unit A using a laser fuse. The group 2 functions to store address-judging data for redundancy, and let it be made up of the fuse circuit unit B using an electric fuse. The group 2, however, may include other data such as chip ID information, for example.

Similarly to the embodiment of FIG. 14 or 14A, basically using the output PWRON of the power-on signal generating circuit 91 as the reference, control signals FSETP1, FSETN1 are generated, and fuse data is read out in the group 1. Further, using the output VgateON of the internal potential detecting circuit 41, control signals FSETP2, FSETN2 are generated with a delay from the control signals FSETP1, FSETN1, and fuse data is read out in the group 2.

The internal potential detecting circuit 41, however, if configured to output the detection signal VgateON based on the reference potential Vref as shown in FIG. 5. Therefore, in case the value of the reference voltage Vref is lower than the programmed value due to fluctuation of the manufacturing process, it may occur that the detection signal VgateON is generated at, for example, an earlier timing substantially equal to the timing of the power-on signal PWRON. In this case, two problems may occur. First, if the read control circuit has the same configuration as that of the embodiment of FIG. 14 or 14A, then a difference in timing may not be ensured between the read control signals FSETP1, FSETN1 for the first group 1 and the read control signals FSETP2, FSETN2 for the second group. This will make the grouping useless.

The other problem lies in that, when the fuse circuit unit B using an electric fuse is employed in the group 2 for address judgment, read operation of fuse data may not be performed normally. That is, as shown in FIG. 3, in case of the fuse circuit unit B using an electric fuse, data of the fuse F2 if first transferred to the node Fb via the transistor T11 controlled by the internal potential Vgate. Thereafter, as a result of the change of the control signal FSETP from "L" to "H" and the change of the control signal FSETN to "H", fuse data Fb is normally transferred and read out. If the control signals FSETP, FSETN change earlier as mentioned above while the internal potential Vgate is insufficient, and hence, the fuse data of a sufficient level is not transferred to the node Fb, then it may cause erroneous read operation.

The read control circuit 7 of FIG. 18 or 18A has means for avoiding these problems. That is, it is configured to input into the NAND gate G13 the output VgateON of the internal potential detecting circuit 41 and the delayed signal of the control signal FSETP1 based on the output PWRON of the power-on signal generating circuit 91 and delayed by inverters G119, G120. As a result, even if the output VgateON of the internal potential detecting circuit 41 changes to "H" earlier, the control signal FSETP2 for the group 2 is not generated before the NAND gate G13 is activated by a delayed signal of the control signal FSETP1 delayed by the inverters G119, G120. Therefore, it is ensured that the control signals FSETP2, FSETN2 for the group 2 change in level certainly later than the control signals FSETP1, FSETN1 for the first group, and two groups 1, 2 are controlled in reading at different timings.

Assume that the fuse data FOUT1 of the group 1 is that for adjusting the internal voltage generating circuit, and based on one output thereof, the reference potential Vref, if lower for a reason concerning the process, is adjusted. Then, as shown in FIG. 5, the detection output VgateON of the internal potential detecting circuit 41 will be output based on the adjusted reference potential Vref, and it is prevented that the detection output VgateON is output before the internal potential Vgate rises sufficiently. Therefore, control signals FSETP2, FSETN2 for the group 2 are generated at normal timings, and even when the fuse circuit unit B using an electric fuse is employed in the group 2, erroneous read operation is reliably prevented.

Figure 19:
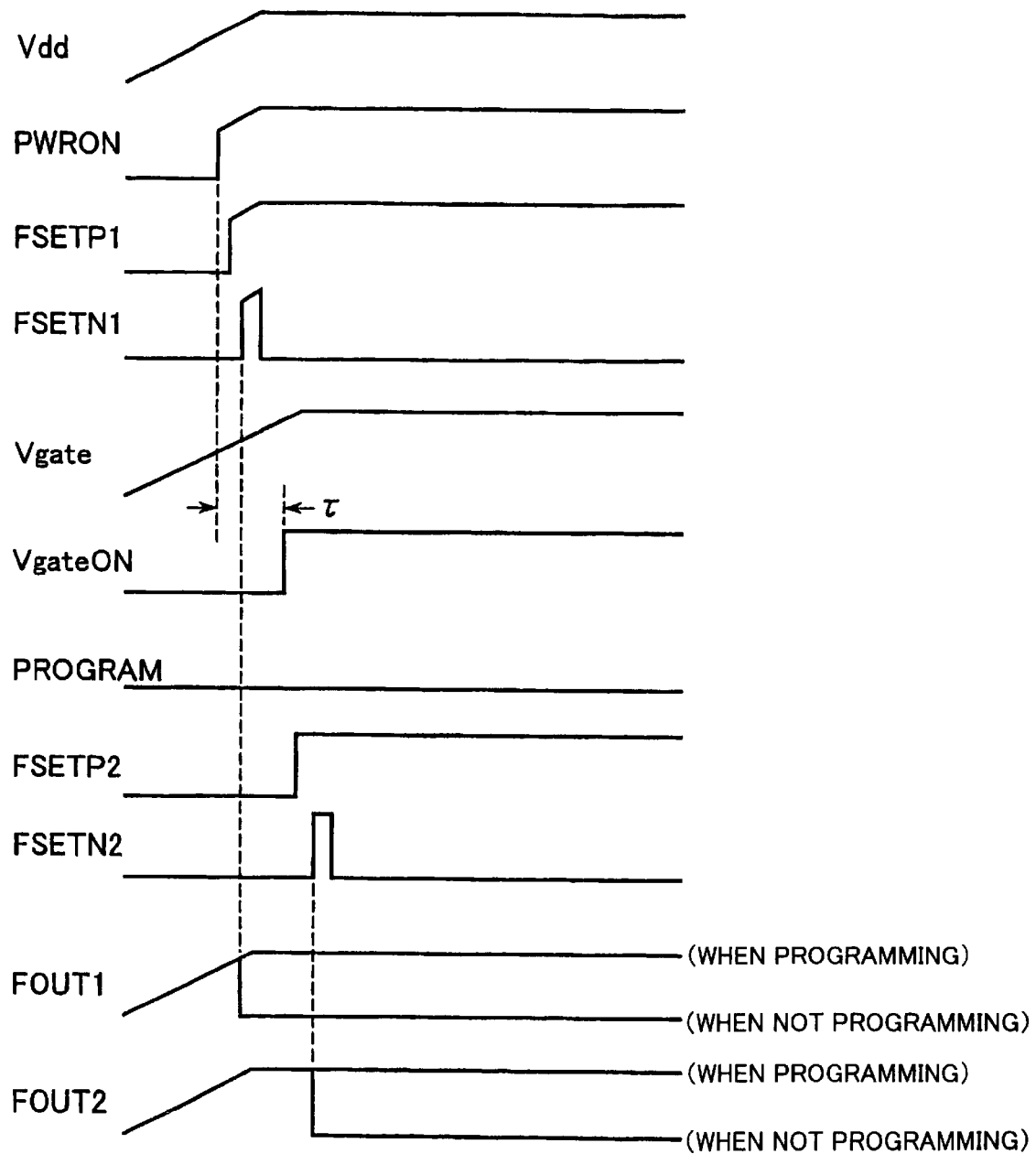
FIG. 19 is a diagram that shows a fuse data read-out waveform of FIG. 18.

FIG. 19 shows waveforms of operations appearing when read operations of fuse data of the respective groups 1, 2 of the control data storage circuit 6 are brought about normally. More specifically, the internal potential detection signal VgateON is generated later than the power-on signal PWRON by time τ. Based on them, read control signals FSETP1, FSETN1 for the group 1 and control signals FSETP2, FSETN2 for the second group sequentially exhibit changes, and fuse data FOUT1 and fuse data FOUT2 are read out with a predetermined delay.

Therefore, according to this embodiment, in addition to the same effects as those of the foregoing embodiments, the effect of preventing influences from process fluctuation is additionally obtained. Especially by using a laser fuse in one of the groups of the control data to store voltage adjusting data and using the fuse data to adjust the internal voltage, erroneous read operation can be prevented reliably when using an electric fuse in the other group.

This scheme of this embodiment, however, is also effective when the group 2 is made of the fuse circuit unit A using a laser fuse.

Figure 20:
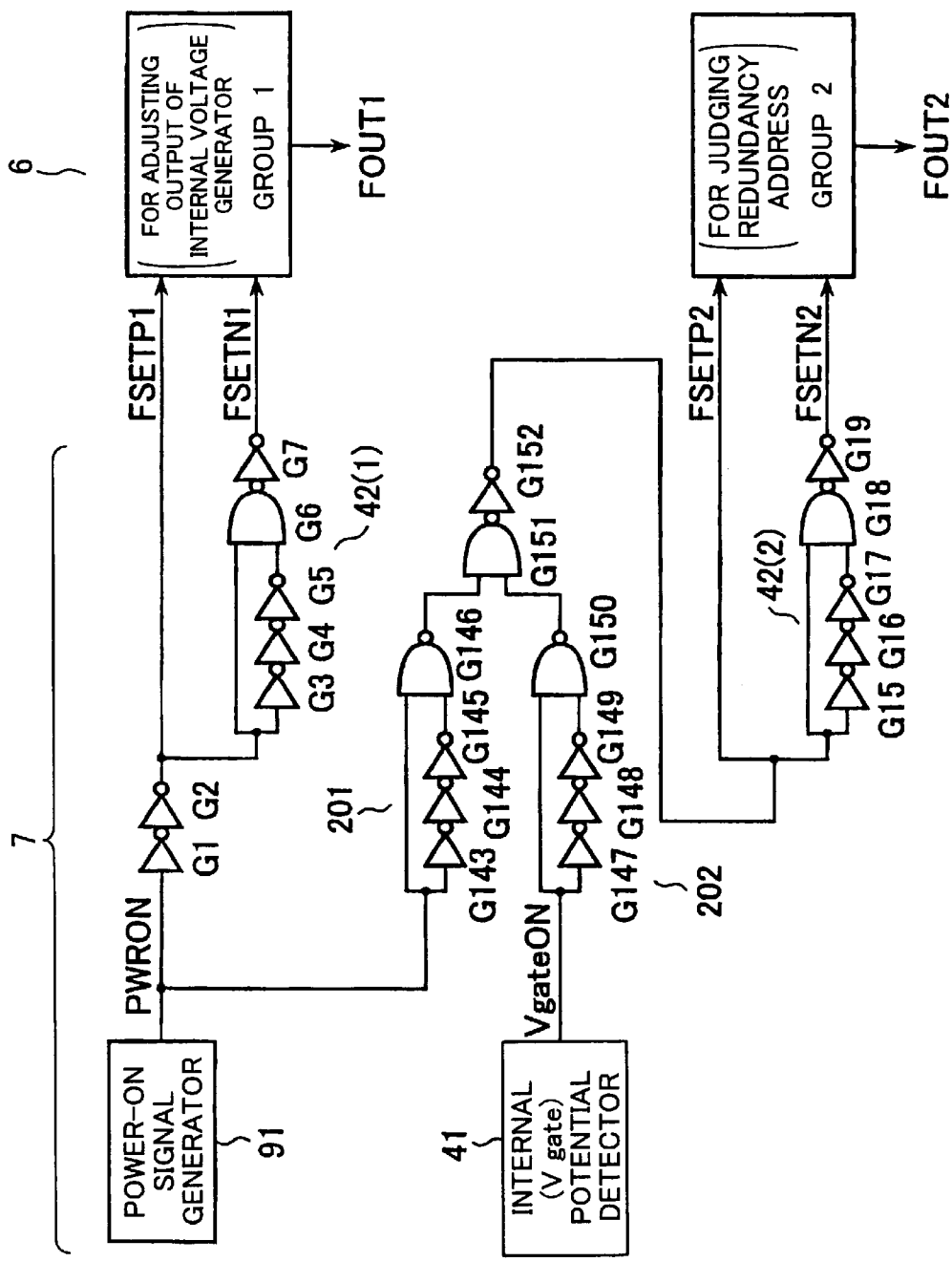
FIGS. 20 and 20A are diagrams that show further configurations of the control data read-out circuit 7 and the control data storage circuit 6 of FIG. 1.
Figure 20A:
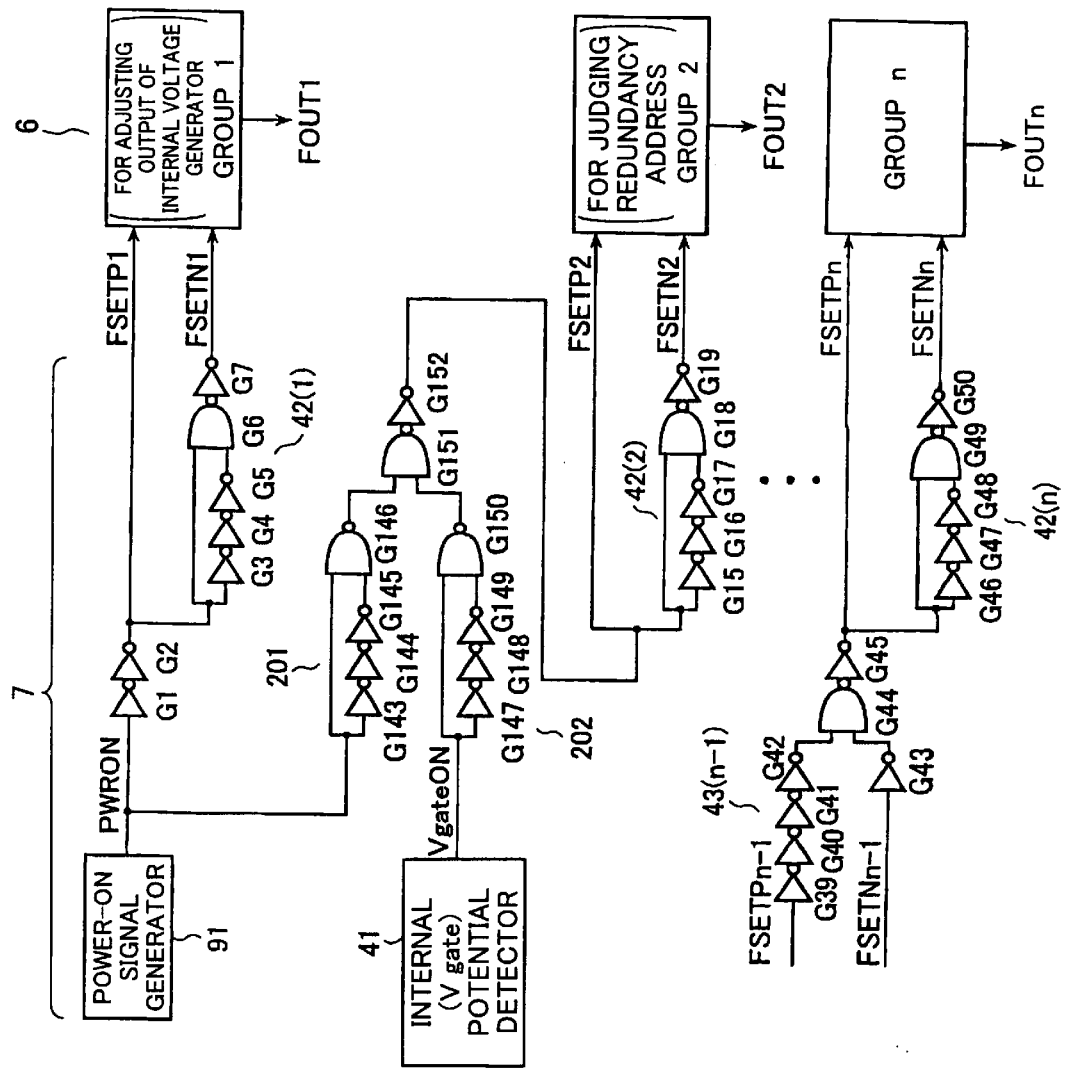

FIGS. 20 and 20A each show an embodiment modified from the embodiment of FIG. 18 or 18A. Configuration of the control data storage circuit 6 may be the same as that of FIG. 18 or 18A. That is, the group 1 of the control data storage circuit 6 functions to store output adjusting data of the internal voltage generating circuit, and let it be made up of the fuse circuit unit A using a laser fuse. The group 2 functions to store address-judging data for redundancy, and let it be made up of the fuse circuit unit B using an electric fuse.

The feature that the control signals FSETP1, FSETN1 for the group 1 are generated based on the output PWRON of the power-on signal generating circuit 91 is the same as that of FIG. 18 or 18A. Regarding the control signals FSETP2, FSETN2 for the group 2, here are used two signals, namely, the output PWRON of the power-on signal generating circuit 91 and the output VgateON of the internal potential detecting circuit 41.

Figure 21:
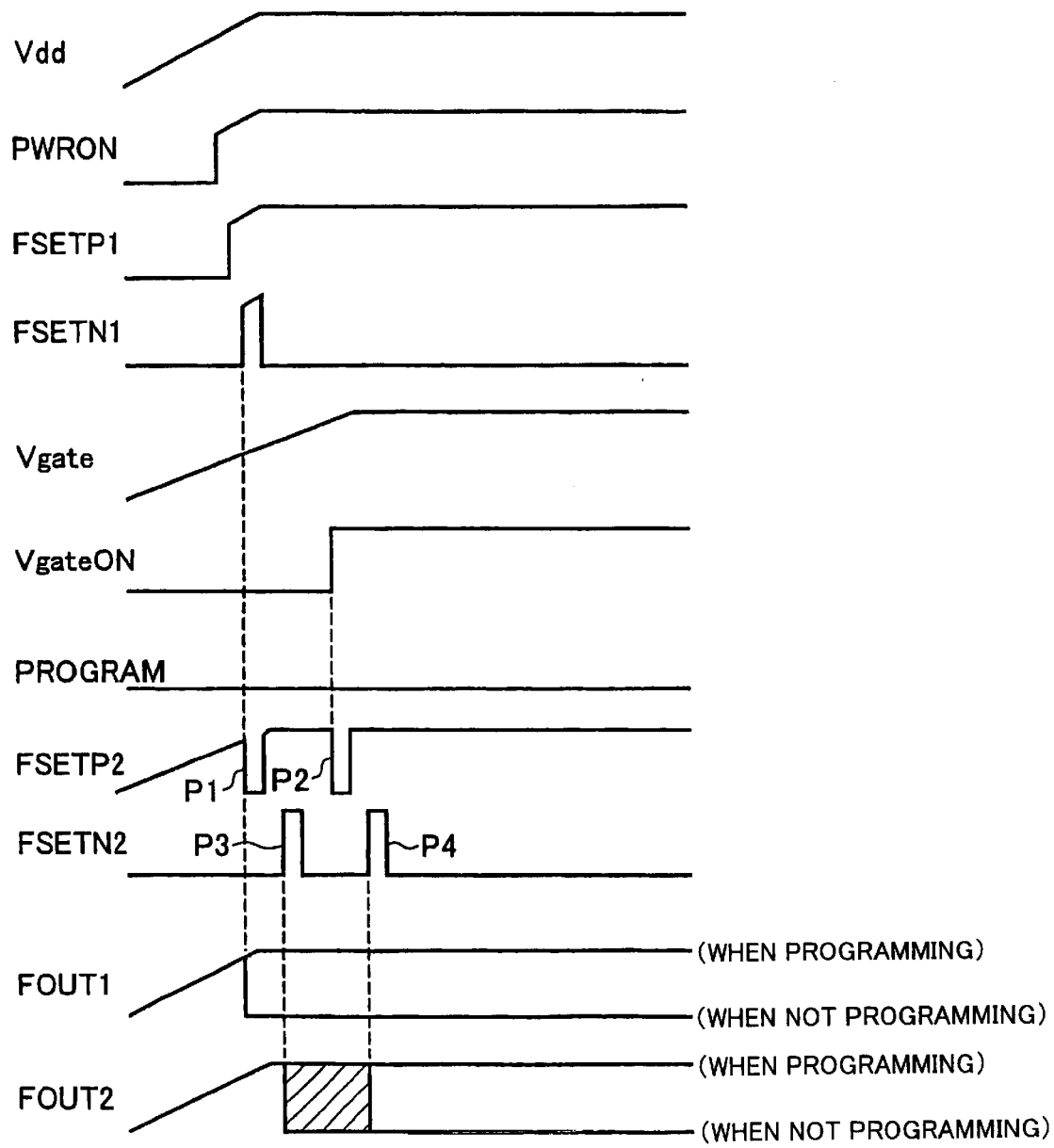
FIG. 21 is a diagram that shows a fuse data read-out waveform of FIG. 20.

More specifically, the rising edge of the power-on signal PWRON is detected by an edge detecting circuit 201, and a negative pulse is generated. Similarly, the rising edge of the internal potential detection signal VgateON is detected by an edge detecting circuit 202, and a negative pulse is generated. These negative pulses become two negative pulses P1, P2 of a control signal FSETP2 after passing a NAND gate G151 and an inverter G152 as shown in FIG. 21. After the first negative pulse P1 returns to "H", a positive pulse P3 of the control signal FSETN2 is generated by the edge detecting circuit 42(2). Similarly, after the later negative pulse P2 returns to "H", a second positive pulse P4 of the control signal FSETN2 is generated by the edge detecting circuit 42(2).

Then, in the fuse circuit of the group 2, in the period of FSETP2="H" where the negative pulse P1 has returned to "H", precharge operation once stops, and the first read operation of the fuse data takes place with the positive pulse P3 of the control signal FSETN2. Further, precharge is conducted again with the negative pulse P2, and when it returns to "H", the precharge operation stops, and the second read operation of the fuse data takes place subsequently with the positive pulse P4 of the control signal FSETN2.

Assume that one of the fuse data OUT1 of the group 1 is used for adjusting the reference potential Vref similarly to the embodiment of FIG. 18 or 18A. Then, even if the first read operation of the fuse data of the group 2 is not attained normally with the first pulse P3 of the control signal FSETN1 based on the power-on signal PWRON, the fuse data in the group 2 is reliably read out normally in the second read operation by the next pulse P4. That is, similarly to the embodiment of FIG. 18 or 18A, this is because the internal potential detecting signal VgateON is reliably generated based on the fuse data FOUT1 of the group 1 after the internal booster potential Vgate reaches a sufficient value, and fuse data transfer and read operation of the fuse circuit unit B using the electric fuse is accomplished reliably.

The scheme of this embodiment, however, is also effective when the group 2 is made of the fuse circuit unit A using a laser fuse.

As described above, according to embodiments of the invention, by dividing the control data storage circuit made of nonvolatile storage devices into groups to read out them at different timings, it is possible to realize a semiconductor integrated circuit having a control data storage circuit limited in peak of power consumption upon read operations.

What is claimed is:

1. A semiconductor integrated circuit comprising:
a control data storage circuit having a plurality of groups each made up of nonvolatile storage devices where control data is programmed, and a latch circuit for holding read control data from said nonvolatile storage devices; and
a read control circuit for controlling read operations of each said control data from said nonvolatile storage devices at different timings for the respective groups.

2. A semiconductor integrated circuit according to claim 1 wherein said read control circuit includes:
an internal potential detecting circuit for detecting the potential at a certain internal node in said semiconductor integrated circuit; and
a read signal generating circuit for generating a plurality of control signals each for each of said groups to allow read operations of said control data from said nonvolatile storage devices at different timings for the respective groups.

3. A semiconductor integrated circuit according to claim 2 wherein said internal node is an output node of an internal booster circuit.

4. A semiconductor integrated circuit according to claim 2 wherein said read signal generating circuit includes plural stages of units connected in series, first one of said units being configured to generate first one of said read control signals to be added to first one of said groups in response to an output from said internal potential detecting circuit, and second or subsequent one of said units being configured to generate second or subsequent one of control signals to be added to second or subsequent one of said groups based on one of said read control signals of one of said units preceding to said second or subsequent unit by one stage.

5. A semiconductor integrated circuit according to claim 1 wherein said read control circuit includes a power-on signal generating circuit for detecting that the power source potential has reached a predetermined level when the power source is powered; and a read signal generating circuit for generating a plurality of control signals each for each of said groups to allow read operations of said control data from said nonvolatile storage devices at different timings for the respective groups.

6. A semiconductor integrated circuit according to claim 5 wherein said power-on signal generating circuit is configured to output a power-on signal when said power source potential exceeds a predetermined value.

7. A semiconductor integrated circuit according to claim 5 wherein said read signal generating circuit includes plural stages of units connected in series, first one of said units being configured to generate first one of said read control signals to be added to first one of said groups in response to an output from said internal potential detecting circuit, and second or subsequent one of said units being configured to generate second or subsequent one of control signals to be added to second or subsequent one of said groups based on one of said read control signals of one of said units preceding to said second or subsequent unit by one stage.

8. A semiconductor integrated circuit according to claim 1 wherein said read control circuit includes a read signal generating circuit for generating a plurality of read control signals each for each of said groups to allow read operations of said control data from said nonvolatile storage devices at different timings for the respective groups on the basis of an externally supplied reset signal.

9. A semiconductor integrated circuit according to claim 8 wherein said read signal generating circuit includes plural stages of units connected in series, first one of said units being configured to generate first one of said read control signals to be added to first one of said groups in response to said reset signal, and second or subsequent one of said units being configured to generate second or subsequent one of control signals to be added to second or subsequent one of said groups based on one of said read control signals of one of said units preceding to said second or subsequent unit by one stage.

10. A semiconductor integrated circuit comprising:
a control data storage circuit having a plurality of groups each made up of nonvolatile storage devices where control data is programmed, and a latch circuit for holding read control data from said nonvolatile storage devices; and
first and second read control circuits each controlling read operations of said control data from said nonvolatile storage devices to take place at different timings for the respective groups.

11. A semiconductor integrated circuit according to claim 10 wherein said first read control circuit includes:
a power-on signal generating circuit for detecting that the power source potential has reached a predetermined level when the power source is powered; and
a first read signal generating circuit for generating a plurality of control signals each for each of said groups to allow read operations of said control data from said nonvolatile storage devices at different timings for the respective groups, and wherein said second read control circuit includes:
   an internal potential detecting circuit for detecting the potential at a certain internal node in said semiconductor integrated circuit; and
   a second read signal generating circuit for generating a plurality of control signals each for each of said groups to allow read operations of said control data from said nonvolatile storage devices at different timings for the respective groups.

12. A semiconductor integrated circuit according to claim 11 wherein said internal node is an output node of an internal booster circuit.

13. A semiconductor integrated circuit according to claim 11 wherein said first read signal generating circuit includes plural stages of units of unit 1 to unit (m−1) connected in series, first one of said units being configured to generate first one of said read control signals to be added to first one of said groups in response to an output from said internal potential detecting circuit, and second or subsequent one of said units being configured to generate second or subsequent one of control signals to be added to second or subsequent one of said groups based on one of said read control signals of one of said units preceding to said second or subsequent unit by one stage, and said second read signal generating circuit includes plural stages of units of unit m to unit n connected in series, m-th unit being configured to generate m-th read control signal to be added to m-th group in response to an output from said power-on signal generating circuit, and (m+1)-th or subsequent unit being configured to generate (m+1)-th or subsequent control signal to be added to (m+1)-th or subsequent group based on one of said read control signals of one of said units preceding to said (m+1)-th or subsequent unit by one stage.

14. A semiconductor integrated circuit according to claim 10 wherein said first read control circuit includes:
   a power-on signal generating circuit for detecting that the power source potential has reached a predetermined level when the power source is powered; and
   a first read signal generating circuit for generating a plurality of control signals each for each of said groups to allow read operations of said control data from said nonvolatile storage devices at different timings for the respective groups, and wherein said second read control circuit includes:
   a second read signal generating circuit for generating a plurality of control signals each for each of said groups to allow read operations of said control data from said nonvolatile storage devices at different timings for the respective groups on the basis of an externally supplied reset signal.

15. A semiconductor integrated circuit according to claim 14 wherein said internal node is an output node of an internal booster circuit.

16. A semiconductor integrated circuit according to claim 14 wherein said first read signal generating circuit includes plural stages of units of unit 1 to unit (m−1) connected in series, first one of said units being configured to generate first one of said read control signals to be added to first one of said groups in response to an output from said power-on signal generating circuit, and second or subsequent one of said units being configured to generate second or subsequent one of control signals to be added to second or subsequent one of said groups based on one of said read control signals of one of said units preceding to said second or subsequent unit by one stage, and said second read signal generating circuit includes plural stages of units of unit m to unit n connected in series, m-th unit being configured to generate m-th read control signal to be added to m-th group in response to said externally supplied reset signal, and (m+1)-th or subsequent unit being configured to generate (m+1)-th or subsequent control signal to be added to (m+1)-th or subsequent group based on one of said read control signals of one of said units preceding to said (m+1)-th or subsequent unit by one stage.

17. A semiconductor integrated circuit according to claim 10 wherein said first read control circuit includes:
   an internal potential detecting circuit for detecting the potential at a certain internal node in said semiconductor integrated circuit; and
   a first read signal generating circuit for generating a plurality of control signals each for each of said groups to allow read operations of said control data from said nonvolatile storage devices at different timings for the respective groups, and wherein said second read control circuit includes:
   a second read signal generating circuit for generating a plurality of control signals each for each of said groups to allow read operations of said control data from said nonvolatile storage devices at different timings for the respective groups on the basis of an externally supplied reset signal.

18. A semiconductor integrated circuit according to claim 17 wherein said internal node is an output node of an internal booster circuit.

19. A semiconductor integrated circuit according to claim 17 wherein said first read signal generating circuit includes plural stages of units of unit 1 to unit (m−1) connected in series, first one of said units being configured to generate first one of said read control signals to be added to first one of said groups in response to an output from said internal potential detecting circuit, and second or subsequent one of said units being configured to generate second or subsequent one of control signals to be added to second or subsequent one of said groups based on one of said read control signals of one of said units preceding to said second or subsequent unit by one stage, and said second read signal generating circuit includes plural stages of units of unit m to unit n connected in series, m-th unit being configured to generate m-th read control signal to be added to m-th group in response to said externally supplied reset signal, and (m+1)-th or subsequent unit being configured to generate (m+1)-th or subsequent control signal to be added to (m+1)-th or subsequent group based on one of said read control signals of one of said units preceding to said (m+1)-th or subsequent unit by one stage.

20. A semiconductor integrated circuit according to claim 10 wherein said first read control circuit includes:
   a power-on signal generating circuit for detecting that the power source potential has reached a predetermined level when the power source is powered; and
   a first read signal generating circuit for generating a plurality of control signals each for each of said groups to allow read operations of said control data from said nonvolatile storage devices at different timings for the respective groups, and wherein said second read control circuit includes:
   an internal potential detecting circuit for detecting the potential at a certain internal node in said semiconductor integrated circuit; and
   a second read signal generating circuit for generating a plurality of control signals each for each of said groups to allow read operations of said control data from said nonvolatile storage devices at different timings for the respective groups.

21. A semiconductor integrated circuit according to claim 20 wherein said internal node is an output node of an internal booster circuit.

22. A semiconductor integrated circuit according to claim 20 wherein said first read signal generating circuit includes plural stages of units of unit 1 to unit (m−1) connected in series, first one of said units being configured to generate first one of said read control signals to be added to first one of said groups in response to an output from said power-on signal generating circuit, and second or subsequent one of said units being configured to generate second or subsequent one of control signals to be added to second or subsequent one of said groups based on one of said read control signals of one of said units preceding to said second or subsequent unit by one stage, and said second read signal generating circuit includes plural stages of units of unit m to unit n connected in series, m-th unit being configured to generate m-th read control signal to be added to m-th group in response to an output from said internal potential detecting circuit, and (m+1)-th or subsequent unit being configured to generate (m+1)-th or subsequent one of control signals to be added to second or subsequent one of group based on one of said read control signals of one of said units preceding to said (m+1)-th or subsequent unit by one stage.

23. A semiconductor integrated circuit according to claim 10 wherein said first read control circuit includes:
a power-on signal generating circuit for detecting that the power source potential has reached a predetermined level when the power source is powered; and
a first read signal generating circuit for generating a control signal to allow read operation of said control data in first one of said groups, and wherein said second read control circuit includes:
an internal potential detecting circuit for detecting the potential at a certain internal node in said semiconductor integrated circuit; and
a second read signal generating circuit having plural stages of units connected in series, first one of said units being configured to generate first one of said read control signals to be added to first one of said groups in response to an output from said internal potential detecting circuit, and second or subsequent one of said units being configured to generate second or subsequent one of control signals to be added to second or subsequent one of said groups based on one of said read control signals of one of said units preceding to said second or subsequent unit by one stage.

24. A semiconductor integrated circuit according to claim 11 wherein said control data storage circuit is divided into a first group made up of a fuse circuit unit using a laser-meltdown fuse and a second group made up of a fuse circuit unit using an electrically programmed fuse, and wherein fuse data of said first group are read out by read control signals generated on the basis of an output from said power-on signal generating circuit, and fuse data of said second group are read out by a read control signals generated with delays from said first read control signals on the basis of an output of said internal potential detecting circuit.

25. A semiconductor integrated circuit according to claim 24 wherein fuse data of said first group contains data for internal voltage adjusting data, and based on the internal voltage adjusting data, the reference voltage used in said internal potential detecting circuit is adjusted.

26. A semiconductor integrated circuit according to claim 23 wherein said control data storage circuit is divided into a first group made up of a fuse circuit unit using a laser-meltdown fuse and a second group made up of a fuse circuit unit using an electrically programmed fuse, and wherein fuse data of said first group are read out by read control signals generated on the basis of an output from said power-on signal generating circuit, and fuse data of said second group are read out by read control signals generated on the basis of an output of said power-on signal generating circuit and an output from said internal potential detecting circuit.

* * * * *